United States Patent
Hawryluk et al.

(10) Patent No.: US 9,558,973 B2
(45) Date of Patent: Jan. 31, 2017

(54) LASER ANNEALING SYSTEMS AND METHODS WITH ULTRA-SHORT DWELL TIMES

(71) Applicant: Ultratech, Inc., San Jose, CA (US)

(72) Inventors: Andrew M. Hawryluk, Lost Altos, CA (US); Serguel Anikitchev, Belmont, CA (US)

(73) Assignee: Ultratech, Inc., San Jose, CA (US)

( * ) Notice: Subject to any disclaimer, the term of this patent is extended or adjusted under 35 U.S.C. 154(b) by 205 days.

(21) Appl. No.: 14/490,446

(22) Filed: Sep. 18, 2014

(65) Prior Publication Data
US 2016/0086832 A1    Mar. 24, 2016
US 2016/0240407 A9    Aug. 18, 2016

Related U.S. Application Data

(62) Division of application No. 13/909,542, filed on Jun. 4, 2013, now Pat. No. 8,865,603.
(Continued)

(51) Int. Cl.
*H01L 21/00*    (2006.01)
*B23K 26/08*    (2014.01)
(Continued)

(52) U.S. Cl.
CPC ......... *H01L 21/67115* (2013.01); *B23K 26/00* (2013.01); *B23K 26/034* (2013.01);
(Continued)

(58) Field of Classification Search
CPC ..... H01L 21/00; H01L 21/02675; B23K 26/08
(Continued)

(56) References Cited

U.S. PATENT DOCUMENTS 4,234,356 A    11/1980   Auston et al.
4,309,225 A *   1/1982   Fan .......................... C30B 1/023
                                                                            117/8
(Continued)

FOREIGN PATENT DOCUMENTS

CA            1129969       8/1982
JP            S57-052052    3/1982
(Continued)

OTHER PUBLICATIONS

Written Opinion for Singapore Patent Application No. 201304296-5 from the Danish Patent and Trademark Office as provided to the Intellectual Property Office of Singapore, wherein the Singapore Patent Application is a counterpart to the above-identified U.S. Patent Application.
(Continued)

*Primary Examiner* — Samuel M Heinrich
(74) *Attorney, Agent, or Firm* — Opticus IP Law PLLC

(57) ABSTRACT

Laser annealing systems and methods for annealing a semiconductor wafer with ultra-short dwell times are disclosed. The laser annealing systems can include one or two laser beams that at least partially overlap. One of the laser beams is a pre-heat laser beam and the other laser beam is the annealing laser beam. The annealing laser beam scans sufficiently fast so that the dwell time is in the range from about 1 μs to about 100 μs. These ultra-short dwell times are useful for annealing product wafers formed from thin device wafers because they prevent the device side of the device wafer from being damaged by heating during the annealing process. Embodiments of single-laser-beam annealing systems and methods are also disclosed.

22 Claims, 16 Drawing Sheets

Related U.S. Application Data

(60) Provisional application No. 61/658,086, filed on Jun. 11, 2012.

(51) Int. Cl.
| | | |
|---|---|---|
| *H01L 21/67* | (2006.01) | |
| *B23K 26/00* | (2014.01) | |
| *B23K 26/03* | (2006.01) | |
| *H01L 21/02* | (2006.01) | |

(52) U.S. Cl.
CPC ........ *B23K 26/08* (2013.01); *H01L 21/02675* (2013.01); *H01L 21/67248* (2013.01); *B23K 2203/56* (2015.10); *H01L 21/00* (2013.01)

(58) Field of Classification Search
USPC ............ 219/121.61, 121.62, 121.65, 121.66; 438/487
See application file for complete search history.

(56) References Cited

U.S. PATENT DOCUMENTS

| | | | |
|---|---|---|---|
| 4,375,993 A | 3/1983 | Mori et al. | |
| 5,357,365 A | 10/1994 | Ipposhi et al. | |
| 5,401,666 A | 3/1995 | Tsukamoto | |
| 5,612,251 A | 3/1997 | Lee | |
| 5,767,003 A | 6/1998 | Noguchi | |
| 5,803,965 A | 9/1998 | Yoon | |
| 5,869,803 A | 2/1999 | Noguchi | |
| 5,908,307 A | 6/1999 | Talwar et al. | |
| 5,930,617 A | 7/1999 | Wu | |
| 5,959,779 A | 9/1999 | Yamazaki et al. | |
| 6,037,640 A | 3/2000 | Lee | |
| 6,066,516 A | 5/2000 | Miyasaka | |
| 6,281,057 B2 | 8/2001 | Aya et al. | |
| 6,303,476 B1 | 10/2001 | Hawryluk et al. | |
| 6,335,509 B1 | 1/2002 | Jung | |
| 6,365,476 B1 | 4/2002 | Talwar et al. | |
| 6,366,308 B1 | 4/2002 | Hawryluk et al. | |
| 6,368,947 B1 | 4/2002 | Yu | |
| 6,383,956 B2 | 5/2002 | Hawryluk et al. | |
| 6,479,821 B1 | 11/2002 | Hawryluk et al. | |
| 6,514,339 B1 | 2/2003 | Jung | |
| 6,521,501 B1 | 2/2003 | Erhardt et al. | |
| 6,524,977 B1 | 2/2003 | Yamazaki et al. | |
| 6,531,681 B1 | 3/2003 | Markle et al. | |
| 6,548,361 B1 | 4/2003 | En et al. | |
| 6,558,991 B2 | 5/2003 | Yamazaki et al. | |
| 6,632,749 B2 | 10/2003 | Miyasaka et al. | |
| 6,693,257 B1 | 2/2004 | Tanaka | |
| 6,730,550 B1 | 5/2004 | Yamazaki et al. | |
| 6,747,245 B2 | 6/2004 | Talwar et al. | |
| 6,881,686 B1 | 4/2005 | Sposili et al. | |
| 6,974,731 B2 | 12/2005 | Yamazaki et al. | |
| 6,987,240 B2 | 1/2006 | Jennings et al. | |
| 7,005,601 B2* | 2/2006 | Jennings ................ | B23K 26/03 219/121.65 |
| 7,015,422 B2 | 3/2006 | Timans | |
| 7,067,403 B2 | 6/2006 | Yamazaki et al. | |
| 7,098,155 B2 | 8/2006 | Talwar et al. | |
| 7,148,159 B2 | 12/2006 | Talwar et al. | |
| 7,220,617 B2 | 5/2007 | Takasaki et al. | |
| 7,279,721 B2* | 10/2007 | Jennings ............ | B23K 26/0066 257/288 |
| 7,317,205 B2 | 1/2008 | Yamazaki et al. | |
| 7,482,254 B2 | 1/2009 | Bakeman | |
| 7,494,942 B2 | 2/2009 | Talwar et al. | |
| 7,595,208 B2 | 9/2009 | Jennings et al. | |
| 7,611,933 B2* | 11/2009 | Leonardi ............ | H01L 21/2026 257/E21.094 |
| 7,619,251 B2 | 11/2009 | Takeshi et al. | |
| 7,879,741 B2 | 2/2011 | Talwar et al. | |
| 7,884,436 B2 | 2/2011 | Mabuchi | |
| 7,915,099 B2 | 3/2011 | Yamazaki et al. | |
| 7,964,036 B2 | 6/2011 | Akita et al. | |
| 8,026,519 B1 | 9/2011 | Anikitchev et al. | |
| 8,269,136 B2 | 9/2012 | Tanaka | |
| 9,413,137 B2* | 8/2016 | Haden ................... | H01S 5/0428 |
| 2002/0048864 A1 | 4/2002 | Yamazaki et al. | |
| 2003/0211670 A1 | 11/2003 | Downey | |
| 2004/0097103 A1 | 5/2004 | Imai et al. | |
| 2004/0171237 A1 | 9/2004 | Tanaka et al. | |
| 2004/0188396 A1 | 9/2004 | Talwar et al. | |
| 2004/0198028 A1 | 10/2004 | Tanaka et al. | |
| 2004/0241922 A1 | 12/2004 | Toida | |
| 2004/0253838 A1 | 12/2004 | Yamazaki et al. | |
| 2004/0259387 A1 | 12/2004 | Yamazaki et al. | |
| 2006/0234458 A1 | 10/2006 | Jennings et al. | |
| 2007/0158315 A1 | 7/2007 | Tanaka et al. | |
| 2008/0008460 A1 | 1/2008 | Timans | |
| 2008/0045040 A1 | 2/2008 | Nakao | |
| 2009/0034071 A1 | 2/2009 | Jennings et al. | |
| 2009/0311880 A1 | 12/2009 | Jennings et al. | |
| 2010/0264123 A1 | 10/2010 | Jennings et al. | |
| 2011/0028003 A1 | 2/2011 | Wang et al. | |
| 2011/0298093 A1 | 12/2011 | Zafiropoulo et al. | |
| 2012/0012170 A1 | 1/2012 | Foss et al. | |
| 2015/0321286 A1* | 11/2015 | Heinemann ........ | B23K 26/0608 219/121.76 |

FOREIGN PATENT DOCUMENTS

| | | |
|---|---|---|
| JP | 2000-260687 | 9/2000 |
| JP | 2001-351863 | 12/2001 |
| JP | 2006-351659 A | 12/2006 |
| JP | 2010-272587 | 12/2010 |
| WO | WO 01/71787 | 9/2001 |

OTHER PUBLICATIONS

Sieno et al, "Backside activation of power device IGBTs by microsecond-pulsed green laser annealing thermally assisted with CW diode laser," 18th IEEE Conf. on Advanced Thermal Processing of Semiconductors, RTP (Sep. 2010), pp. 140-143 (print ISBN: 978-1-4244-8400-3).

Office Action issued by the Japanese Patent Office on Jan. 14, 2015, for JP Patent Application No. 2013-118693, which is a counterpart to the above-identified Application.

Office Action issued by the Japanese Patent Office on Apr. 26, 2016, for JP Patent Application No. 2015-068412, which is a counterpart to the above-identified Application.

Office Action issued by the Taiwan Patent Office on Jul. 15, 2016, for Taiwan Patent Application No. 10212086, which is a counterpart to the above-identified Application.

Search Report issued by the Intellectual Property Office of Singapore Oct. 22, 2015, for Singapore Patent Application No. 10201503478U, which is a counterpart to the above-identified Application.

Written Opinion issued by the Intellectual Property Office of Singapore Apr. 28, 2016, for Singapore Patent Application No. 10201503478U, which is a counterpart to the above-identified Application.

* cited by examiner

9,558,973 B2

LASER ANNEALING SYSTEMS AND METHODS WITH ULTRA-SHORT DWELL TIMES

CLAIM OF PRIORITY

This application is a divisional application of U.S. patent application Ser. No. 13/909,542, filed on Jun. 4, 2013, and which is incorporated by reference herein and which claims the benefit of priority under 35 U.S.C. §119(e) of U.S. Provisional Application Ser. No. 61/658,086, filed on Jun. 11, 2012, which is incorporated herein by reference.

FIELD

The present disclosure relates generally to laser annealing of semiconductor materials when forming integrated circuit structures, and in particular relates to systems for and methods of ultra-short laser annealing having a relatively high degree of temperature uniformity.

BACKGROUND ART

There are a variety of applications that require the use of a line image having a relatively uniform intensity. One such application is laser thermal processing (LTP), also referred to in the art as laser spike annealing (LSA), or just "laser annealing." Laser annealing is used in semiconductor manufacturing for a variety of applications, including for activating dopants in select regions of devices (structures) formed in a semiconductor wafer when forming active microcircuits such as transistors and related types of semiconductor features.

One type of laser annealing uses a scanned line image from a light beam to heat the surface of the wafer to a temperature (the "annealing temperature") for a time long enough to activate the dopants in the semiconductor structures (e.g., source and drain regions) but short enough to prevent substantial dopant diffusion. The time that the wafer surface is at the annealing temperature is determined by the power density of the line image, as well as by the line-image width divided by the velocity at which the line image is scanned (the "scan velocity").

To achieve high wafer throughput in a commercial laser annealing system, the line image should be as long as possible, while also having a high power density. An example range for usable line-image dimensions is 5 mm to 100 mm in length (cross-scan direction) and 25 microns to 500 microns in width (scan direction), with typical dimensions being 10 mm long by 100 microns wide. To achieve uniform annealing, it is also necessary for the intensity profile along the line-image length to be as uniform as possible, while non-uniformities along the line-image width are averaged out during the scanning process.

Typical semiconductor processing requirements call for the annealing temperature to be between 1000° C. and 1300° C., with a temperature uniformity of +/−3° C. To achieve this degree of temperature uniformity, the line image formed by the annealing light beam needs to have a relatively uniform intensity in the cross-scan direction, which under most conditions is within +/−5%.

Typical semiconductor applications require an annealing time of 0.1 milliseconds to 10 milliseconds (ms). To meet this requirement, a mechanical stage can be used to move the wafer perpendicular to the long dimension of the beam. With a stage velocity of 100 mm/sec and a short beam width of 100 microns, the thermal annealing (dwell) time is 1 ms.

Unfortunately, for certain semiconductor device fabrication situations, the annealing temperature and annealing time are constrained by other factors, such as wafer thickness and the type of semiconductor device structures formed on the wafer. In such situations, the conventional annealing (dwell) times provided by conventional laser annealing systems are unsuitable.

SUMMARY

Laser annealing systems and methods for annealing a wafer with ultra-short dwell times are disclosed. The laser annealing systems can include one or two laser beams that at least partially overlap. One of the laser beams is a pre-heat laser beam and the other laser beam is the annealing laser beam. The annealing laser beam scans sufficiently fast so that the dwell time is in the range from about 1 µs to about 100 µs. These ultra-short dwell times are useful for annealing product wafers formed from thin device wafers because they prevent the device side of the device wafer from being damaged by heating during the annealing process. Embodiments of single-laser-beam annealing systems and methods are also disclosed.

A first aspect of the disclosure is an ultra-fast laser annealing system for annealing a semiconductor wafer having a wafer surface. The ultra-fast laser annealing system includes a primary laser system, a secondary laser system. The primary laser system forms a primary image on the wafer surface at a first wavelength. The primary image increases an amount of absorption of light at a second wavelength. The secondary laser system forms a secondary image on the wafer surface at the second wavelength. The secondary image resides at least partially within the primary image. The secondary laser system includes a scanning optical system that scans the secondary image over the wafer surface with a dwell time of between 1 µs and 100 µs. That causes the wafer surface to reach a peak annealing temperature $T_{AP}$ between 350° C. and 1250° C.

The ultra-fast laser annealing system preferably further includes a thermal emission detector system, a collection optical system, a power sensor and a controller. The thermal emission detector system is operably arranged to detect thermal emission radiation from the wafer surface at the location of the secondary image and generate an electrical thermal emission signal. The collection optical system is operably arranged to collect reflected light from the secondary laser beam that reflects from the wafer surface at the location of the secondary image and generate an electrical reflected light signal. The power sensor is arranged to measure an amount of power in the secondary laser beam and generate an electrical power signal representative thereof. The controller is operably connected to the thermal emission detector system, the collection optical system, the power sensor and the secondary laser system. The controller is configured to receive and process the electrical thermal emission signal, the electrical power signal and the electrical reflected light signal and determine a wafer surface temperature $T_S$ at the location of the secondary image.

In the ultra-fast laser annealing system, the thermal emission detector system and the scanning optical system preferably include overlapping optical path sections.

In the ultra-fast laser annealing system, the controller is preferably configured to control an amount of power in the secondary laser beam based on the measured wafer surface temperature $T_S$.

In the ultra-fast laser annealing system, the primary and secondary images preferably generate a peak annealing temperature that does not vary over the semiconductor wafer by more than +/−3° C.

In the ultra-fast laser annealing system, the scanning optical system preferably includes a scanning mirror operably connected to a mirror driver. The mirror driver is operably connected to and controlled by the controller.

In the ultra-fast laser annealing system, the first wavelength is preferably in the range from 300 nm to 650 nm.

In the ultra-fast laser annealing system, the second wavelength is preferably in the range from 500 nm to 10.6 microns.

In the ultra-fast laser annealing system, the secondary laser system preferably includes a fiber laser having an output power of between 50 watts and 5000 watts.

In the ultra-fast laser annealing system, the semiconductor wafer preferably includes a device wafer having thickness in a range: a) from 10 μm to 100 μm, or b) from 500 μm to 1,000 μm.

A second aspect of the disclosure is a method of annealing a semiconductor wafer having a wafer surface. The method includes forming a primary image on the wafer surface at a first wavelength. The primary image increases an amount of absorption of light at a second wavelength. The method also includes forming a secondary image on the wafer surface at the second wavelength. The secondary image resides at least partially within the primary image. The method also includes scanning the secondary image over the wafer surface with a dwell time of between 1 μs and 100 μs and that causes the wafer surface to reach a peak annealing temperature $T_{AP}$ between 350° C. and 1250° C.

In the method, the first wavelength is preferably in the range from 300 nm to 650 nm.

In the method, the second wavelength is preferably in the range from 500 nm to 10.6 microns.

The method preferably further includes measuring a wafer surface temperature $T_S$ at the location of the scanned secondary image. The method also preferably further includes controlling an amount of power in the secondary laser beam for forming the secondary image in order to keep the peak annealing temperature $T_{AP}$ to within +/−3° C.

In the method, measuring the wafer surface temperature $T_S$ preferably includes measuring an amount of power in the secondary laser beam. Measuring the wafer surface temperature $T_S$ also preferably includes measuring an amount of thermal radiation emitted from the location of the scanned secondary image. Measuring the wafer surface temperature $T_S$ also preferably includes measuring an amount of reflected light from the location of the secondary image caused by reflection of the secondary light beam. Measuring the wafer surface temperature $T_S$ also preferably includes calculating the wafer surface temperature $T_S$ using a look up table obtained from a calibration process.

A third aspect of the disclosure is an ultra-fast laser annealing system for annealing a semiconductor wafer having an annealing surface. The ultra-fast laser annealing system includes a laser and a scanning optical system. The laser generates a laser beam having an annealing wavelength in the range from about 300 nm to about 650 nm. The scanning optical system receives the laser beam and scans the laser beam age over the annealing surface as a scanned image having a dwell time of between 1 μs and 100 μs. That causes the annealing surface to reach a peak annealing temperature $T_{AP}$ between 350° C. and 1250° C.

In the ultra-fast laser annealing system, the semiconductor wafer is preferably a product wafer formed from a device wafer and a carrier wafer. The device wafer defines the annealing surface and has a thickness in the range from about 10 μm to about 100 μm.

In the ultra-fast laser annealing system, the scanning optical system is preferably configured as an F-theta scanning system.

A fourth aspect of the disclosure is a method of annealing a semiconductor wafer having an annealing surface. The method includes forming an image on the annealing surface using a laser beam having a wavelength in the range from about 300 μm to about 650 μm. The method also includes scanning the image over the annealing surface with a dwell time of between 1 μs and 100 μs. That causes the annealing surface to reach a peak annealing temperature $T_{AP}$ between 350° C. and 1250° C.

In the method, the semiconductor wafer is preferably a product wafer formed from a device wafer and a carrier wafer. The device wafer defines the annealing surface and has a thickness in the range from about 10 μm to about 100 μm.

In the method, scanning the image is preferably performing using an F-theta scanning optical system.

A fifth aspect of the disclosure is a method of annealing a photoresist layer supported by a surface of a semiconductor wafer. The method includes forming an image on the surface of the semiconductor wafer using a laser beam having a wavelength in the range from about 300 nm to about 1000 nm. The method also includes scanning the image over the surface of the semiconductor wafer with a dwell time of between 100 μs and 1 ms. That causes the photoresist layer to reach a peak annealing temperature $T_{AP}$ between about 300° C. and about 400° C.

In the method, the laser beam and semiconductor wafer preferably define a thermal diffusion length $L_{DIFF}$ and an associated optical absorption depth $D_{AD}$ in the semiconductor wafer. The image scanning is carried out such that $D_{AD}<L_{DIFF}$.

All references cited herein are incorporated by reference herein.

The claims as set forth below are incorporated into and constitute part of the Detailed Description.

DETAILED DESCRIPTION

Reference is now made in detail to embodiments of the disclosure, examples of which are illustrated in the accompanying drawings. Whenever possible, the same or like reference numbers and symbols are used throughout the drawings to refer to the same or like parts.

Figure 1A:
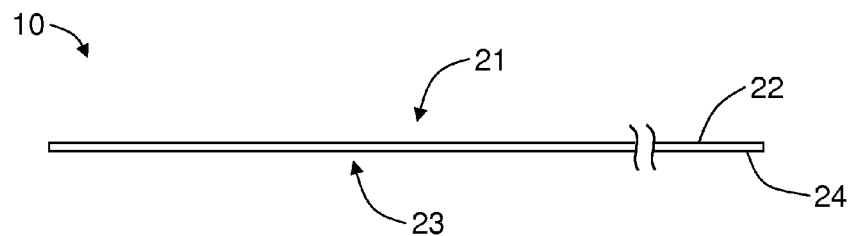
FIGS. 1A through 1D are various views of example wafers that can be subject to laser annealing using the dual-beam ultra-fast laser annealing systems and methods of the present disclosure.

The fabrication of certain types of semiconductor devices, such as image sensors and high-power devices, involves the use of relatively thin semiconductor wafers. FIG. 1A is an example side view of a product wafer 10 having a top side 21 that defines a top surface 22 and a back side 23 that defines a back surface 24.

Figure 1B:
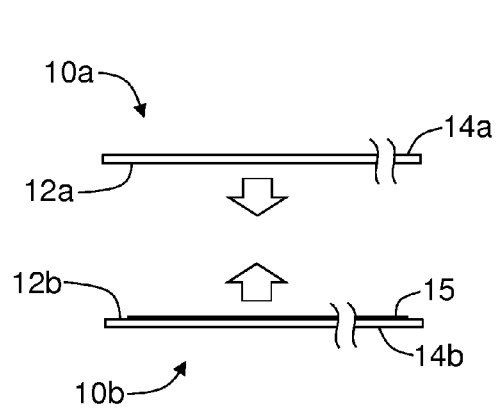
Figure 1C:
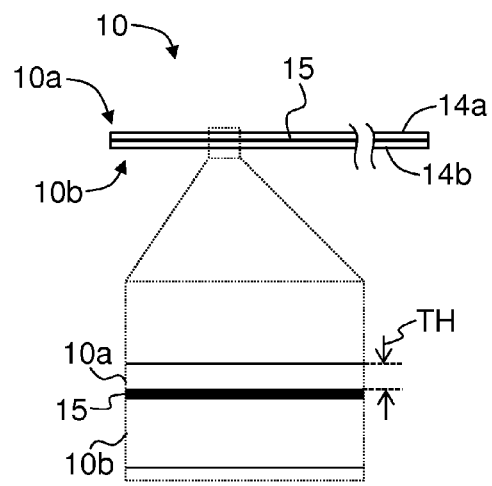

FIG. 1B illustrates the formation of an example product wafer 10 formed by interfacing a device wafer 10a and a carrier wafer 10b. The device wafer 10a has a front side 12a in which devices are formed and is also called the device side, and an opposite back side 14a. The carrier wafer 10b has a front side 12b on which an oxide layer 15 is formed, and an opposite back side 14b. The resulting wafer 10, referred to herein as a product wafer, is formed interfacing the device side 12a of the device wafer 10a with the front side 12b of the carrier wafer 10b. The oxide layer 15 serves as a bonding layer that bonds the two wafers 10a and 10b together. Thus, the front side 12b of the carrier wafer 10b is also called the bonding side. The resulting product wafer 10 is shown in FIG. 1C. At this point, the device wafer 10a is ground down from the back side 14a to reduce the thickness of the device wafer 10a from about 750 μm to a thickness TH in the range from about 10 μm to about 100 μm, as shown in the close-up inset of FIG. 1C.

Figure 1D:
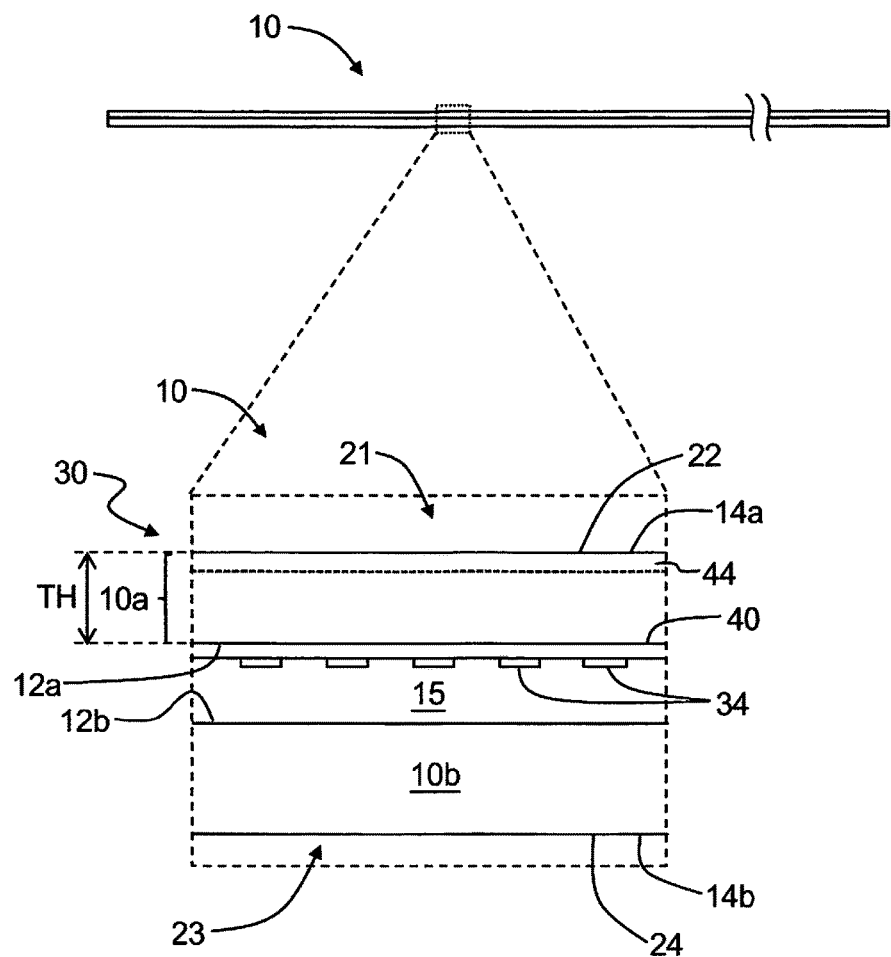

FIG. 1D is similar to FIG. 1C and includes an inset that shows a more detailed close-up cross-sectional view of an example structure 30 of the product wafer 10. The example structure 30 is in the form of a CMOS sensor. The carrier wafer 10b with the oxide layer 15 (which is about 4 μm thick) supports the device wafer 10a, which includes metallization features 34 (e.g., lines) that extend into the oxide layer 15. The metallization features 34 make contact with an adjacent CMOS device layer 40. The CMOS device layer 40 is in turn supported by the thinned device wafer 10a, which as mentioned above has a thickness TH in the range from about 10 μm to 100 μm. In another example, the thickness TH is in the range from about 500 μm to about 1,000 μm.

A thin ion-implant layer 44 that needs to be laser annealed is formed in the thinned device wafer 10a adjacent its back side 14a, which defines the top surface 22. The annealing of thin ion-implant layer 44 serves to make the ion-implant layer 44 conducting, which in turn allows it to serve as an electrical contact layer.

In the example CMOS device structure 30, the electronic features of the CMOS device reside from about 10 μm to about 100 μm away from the back side 14a, which is usually not patterned. Thus, in an example back side 14a of the device wafer 10a defines a flat and unpatterned top surface 22 of the wafer 10 that makes for a good annealing surface.

The device side 12a of the wafer 10 must remain at relatively low temperatures (an in particular below the melt temperature of metallization features 34) to protect the ultimate functionality of the CMOS device. The maximum temperature at the device side 12a is determined by the particular metals used for the metallization features 34, but is typically around 900° C. for copper interconnects and 600° C. for aluminum interconnects.

The constraint that the device features at the device side 12a need to remain below the metallization melt temperature gives rise to the requirement that the laser thermal annealing time must be short enough so that the device surface does not become too hot. This implies that the thermal annealing time (dwell time) must be such that the corresponding thermal diffusion length $L_{DIFF}$ must be less than the thickness TH of the device wafer 10a.

For example, if the nominal thickness TH of the device wafer 10a is 10 microns, then the corresponding thermal annealing (dwell) time must be less than 10 μs based on the thermal diffusion length $L_{DIFF}$ in bulk silicon for a 10 μs laser pulse being approximately 10 μs. Unfortunately, achieving such short dwell times $t_D$ is not consistent with the fundamental architecture for conventional laser annealing tools that utilize a 1-10 mm long, ~100 micron wide laser line image that is scanned at ~100 mm/sec.

Aspects of the disclosure are thus directed to a single-beam or a dual-beam laser annealing system that can be used for both melt and sub-melt laser annealing applications. The dwell time $t_D$ of the annealing beam is between 1 μs and 100 μs. In addition, a laser temperature control system is optionally used to keep the annealing temperature $T_A$ substantially constant, i.e., to within an average wafer surface temperature $T_S$ of +/−3° C.

As discussed above, some semiconductor device manufacturing applications would benefit from having a laser annealing process with a dwell time $t_D$ (annealing time $t_A$) of 100 μs or smaller, such as in the range from 1 μs to 100 μs. It is desired that the thermal diffusion length $L_{DIFF}$ associated the annealing time $t_A$ be less than a physical dimension of the wafer 10, for example the thickness TH of the device wafer 10a.

It is noted here that while the systems and methods disclosed herein have particular applicability to the product wafers 10 formed as described above from a relatively thick carrier wafer 10b that supports a relatively thin device wafer 10a, the systems and methods are also applicable to laser annealing of conventional "thick" semiconductor wafers in situations where it is desirable to limit the amount of diffusion. An example of such a situation is the formation of shallow source and drains in forming transistors, such as described in U.S. Pat. No. 6,365,476, U.S. Pat. No. 6,380,044 and U.S. Pat. No. 6,747,245. In the discussion below, the top surface 22 is the surface of wafer 10 that is being annealed and can either be the "front side" of a conventional wafer or the "back side" 14a of the above-described product wafer 10.

Figure 2:
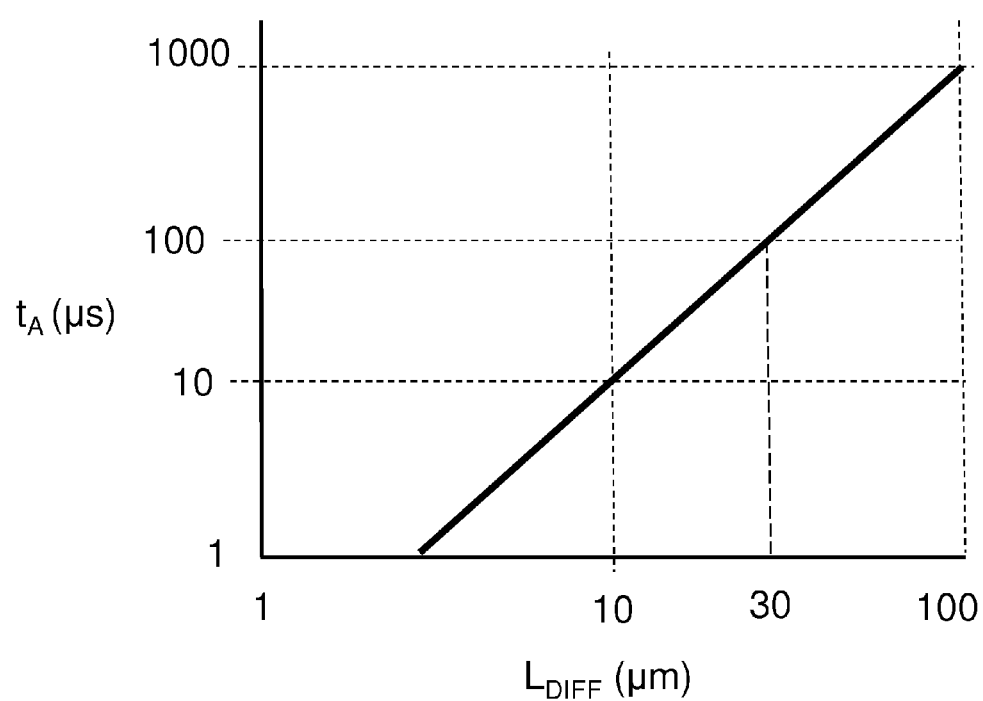
FIG. 2 is a plot of the annealing time $t_A$ (μs) versus the diffusion length $L_{DIFF}$ (μm) for bulk silicon.

FIG. 2 is a plot of the annealing time $t_A$ (μs) versus the thermal diffusion length $L_{DIFF}$ (μm) for bulk silicon. From the plot, it can be seen that for $L_{DIFF}$=10 μm, the corresponding annealing time $t_A$≈10 μs, while for $L_{DIFF}$=30 μm, $t_A$≈100 μs. For the product wafers 10 having a device wafer thicknesses TH about the same as these thermal diffusion lengths $L_{DIFF}$, one can see that the annealing times $t_A$ have to be correspondingly small.

Figure 3:
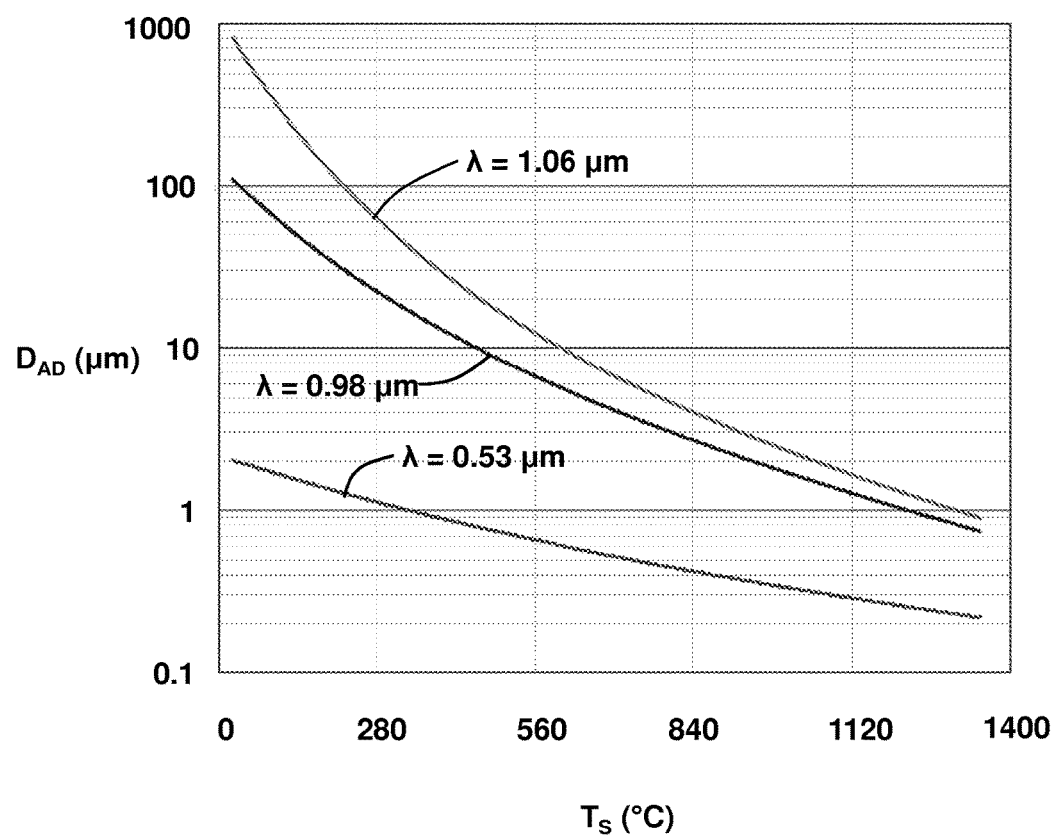
FIG. 3 plots the optical absorption depth $D_{AD}$ (μm) versus the wafer surface temperature $T_S$ (° C.) for wavelengths λ=1.06 μm, 0.98 μm and 0.53 μm.

There is also the additional requirement that the optical absorption depth $D_{AD}$ of the laser annealing beam into the wafer 10 be less than the thermal diffusion length $L_{DIFF}$. FIG. 3 plots the optical absorption depth $D_{AD}$ versus the wafer surface temperature $T_S$ for wavelengths λ=1.06 μm, 0.98 μm and 0.53 μm. The plot of FIG. 3 indicates that for a device wafer thickness TH≈10 μm and at a relatively low temperature (e.g., 280° C. or below), one can use a laser with a wavelength λ≈500 nm since the thermal diffusion length $L_{DIFF}$ for this wavelength is less than the device wafer thickness TH, while the other wavelengths have thermal diffusion lengths $L_{DIFF}$ that are greater than the device wafer thickness TH. For the device wafer thicknesses TH in the range from about 50 μm to about 100 μm, a laser with a wavelength λ≈980 nm can be used. Notice that for higher wafer surface temperatures $T_S$, the optical absorption depth $D_{AD}$ shortens and thermal diffusion becomes the dominant heat distribution mechanism.

From the plots of FIGS. 2 and 3, it is determined that for product wafers 10 formed using relatively thin device wafers 10a, it is desirable to use ultra-short annealing times and annealing wavelengths whose optical absorption depths $D_{AD}$ match the desired thermal diffusion lengths $L_{DIFF}$.

Dual-Beam Ultra-Fast Annealing System

For a given product wafer 10 having a particular device wafer thickness TH, one can optimize the laser annealing system at a single wavelength. For example, in an image sensor fabrication application where the device wafer thickness TH is on the order of 10 microns to 30 microns, one can select a dwell time $t_D$ of 10 microseconds and a 532 nm laser wavelength. For fabricating power devices, where the device wafer thickness TH is approximately 50 microns, one can select a dwell time $t_D$ of 25 microseconds and a longer wavelength laser. Examples of ultra-fast single-laser annealing are described below.

However, by combining two laser beams that use different wavelengths, the laser annealing system becomes more versatile. For example, in one embodiment of a dual-beam laser annealing system described herein, one laser beam can have a relatively short wavelength that enables absorption by a second laser beam having a relatively long wavelength.

Figure 4:
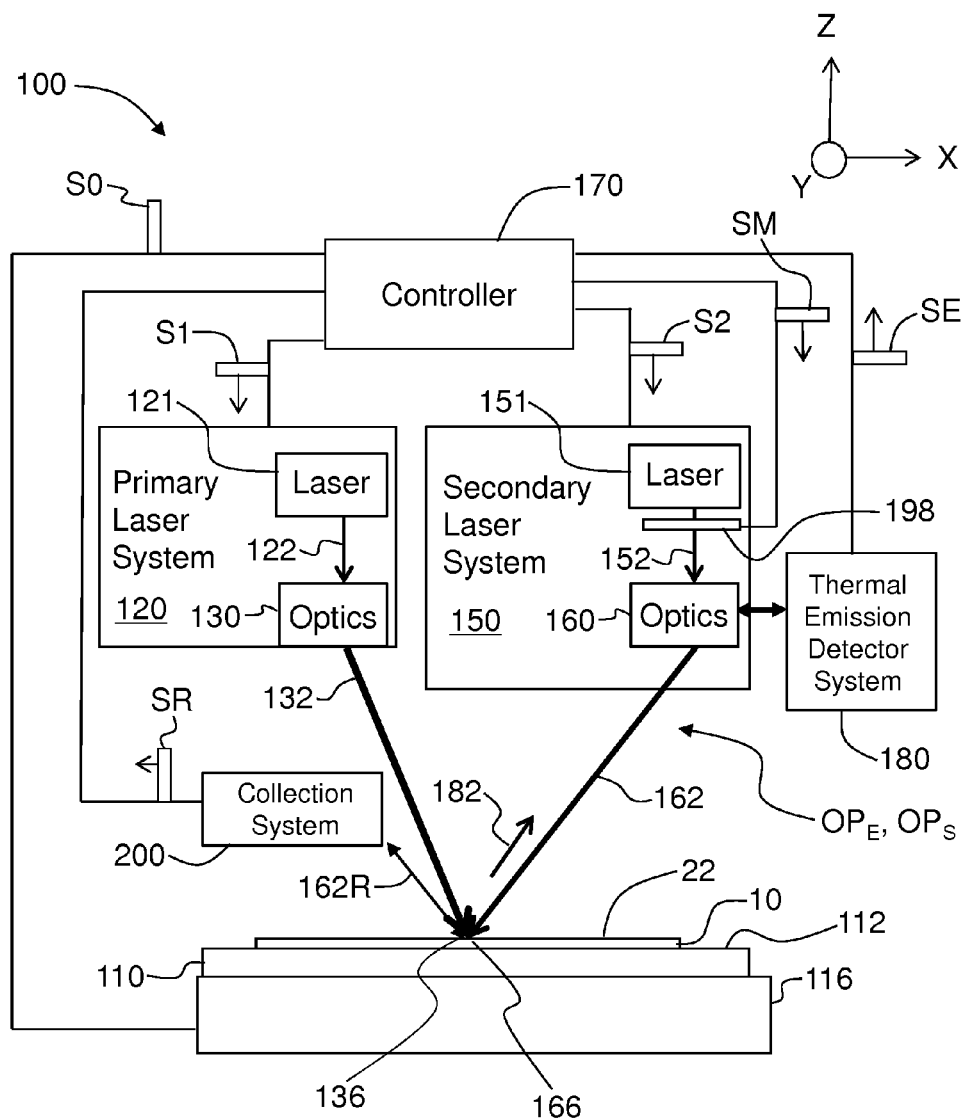
FIG. 4 is a schematic diagram of an example dual-beam ultra-fast laser annealing system.

FIG. 4 is a schematic diagram of an example dual-beam ultra-fast laser annealing system ("system") 100. The system 100 includes a chuck 110 having an upper surface 112 that supports the wafer 10. The chuck 110 in turn is operably supported by a wafer stage 116, which in an example is translatable and rotatable, i.e., is movable in all three orthogonal dimensions and as well as in three orthogonal rotational directions to position the wafer 10 as needed.

The system 100 also includes a primary laser system 120 that includes a primary laser 121 that generates an initial primary laser beam 122 and a secondary laser system 150 having a secondary laser 151 that generates an initial secondary laser beam 152. The primary laser system 120 includes a primary optical system ("optics") 130 configured to receive the initial primary laser beam 122 and form therefrom a primary laser beam 132. In an example, the primary optical system 130 includes a scanning optical system. Likewise, the secondary laser system 150 includes a secondary optical system ("optics") 160 configured to receive the initial secondary laser beam 152 and form therefrom a secondary laser beam 162. The secondary optical system 160 is configured as a scanning optical system and so is referred to hereinafter as scanning optical system 160.

Example primary optical systems 130 and scanning optical systems 160 can include lenses, mirrors, apertures, filters, active optical elements (e.g., variable attenuators, etc.) and combinations thereof. In an example, one or both of the primary optical system 130 and the scanning optical system 160 are configured to perform beam conditioning, e.g., uniformized their respective laser beams 132 and 162 and/or provide the laser beams 132 and 162 with a select cross-sectional shape. Example optical systems suitable for performing such beam conditioning are disclosed in U.S. Pat. Nos. 7,514,305, 7,494,942, 7,399,945 and 6,366,308, and U.S. patent application Ser. No. 12/800,203.

The primary and secondary laser beams 132 and 162 have respective wavelengths $\lambda_1$ and $\lambda_2$ that in one example are both capable of heating the wafer 10 under select conditions. In another example, one wavelength (say, $\lambda_1$) is used to enhance the wafer 10 heating of the other wavelength ($\lambda_2$). For example, one of the wavelengths $\lambda_1$ or $\lambda_2$ can having a bandgap energy greater than the semiconductor bandgap energy of the wafer 10, thereby causing the wafer 10 to absorb primary and secondary laser beams 132 and 162 to a degree sufficient to heat the wafer 10 to annealing temperatures $T_A$. An example range for $\lambda_2$ is 500 nm to 10.6 microns.

The system 100 also includes a thermal emission detector system 180 arranged and configured to measure an amount of thermal emission radiation 182 from the top surface 22 of the wafer 10 as described below and generate an electrical thermal emission signal SE. In an example, the thermal emission detector system 180 measures emissivity E from the top surface 22 of the wafer 10 and the electrical thermal emission signal SE is representative of the measured emissivity. In an example, the thermal emission detector system 180 utilizes at least a portion of the secondary laser system 150 so that it can track the scanned secondary image 166, as discussed below.

In an example embodiment, the thermal emission detector system 180 and the scanning optical system 160 have respective optical path sections $OP_E$ and $OP_S$ that overlap. This configuration enables the thermal emission detector system 180 to collect thermal emission radiation 182 from the location of the secondary image 166 (introduced and discussed below) even while the secondary image 166 is scanning over the top surface 22 of the wafer 10.

The system 100 also includes a collection optical system 200 used to collect and detect a reflected light 162R from the top surface 22 of the wafer 10 and generate an electrical signal SR ("reflected light signal") representative of the amount of detected reflected light 162R.

In an example embodiment, the system 100 further includes a controller 170 electrically connected to the wafer stage 116 and is configured to control the movement of the wafer stage 116 via instructions from the controller 170 as provided by a stage control signal S0.

In an example embodiment, the controller 170 is or includes a computer, such as a personal computer or workstation. The controller 170 preferably includes any of a number of commercially available micro-processors, a suitable bus architecture to connect the processor to a memory device, such as a hard disk drive, and suitable input and output devices (e.g., a keyboard and a display, respectively). The controller 170 can be programmed via instructions (software) embodied in a computer-readable medium (e.g., memory, processor or both) that cause the controller 170 to carry out the various functions of system 100 to effectuate annealing of the wafer 10.

The controller 170 is also operably connected to the primary laser system 120 and the secondary laser system 150 and controls the operation of these laser systems 120 and 150 via respective control signals S1 and S2. In an example, the controller 170 includes digital signal processors (DSPs) (not shown) to control scanning functions in the primary and secondary laser systems 120 and 150. The controller 170 is also operably connected to the thermal emission detector system 180 and the collection optical system 200 and is configured to receive and process the electrical thermal emission signal SE and reflected light signal SR as described below.

Figure 5A:
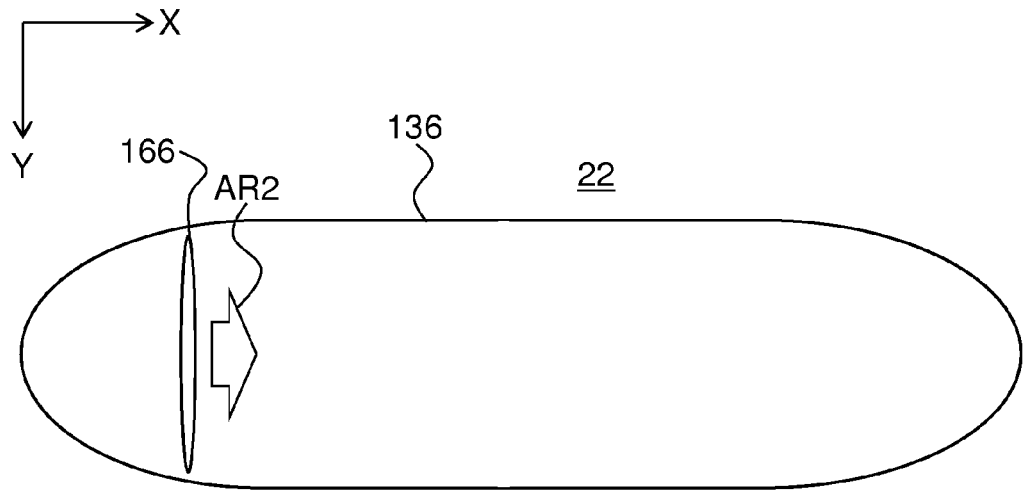
FIGS. 5A through 5E are schematic diagrams that illustrate example embodiments of the relative sizes and orientations of the primary and secondary images formed on the wafer surface by the dual-beam ultra-fast laser annealing system of FIG. 1.

With continuing reference to FIG. 4, the primary laser beam 132 is directed onto the top surface 22 of the wafer 10 to form a primary image 136 thereon, while the secondary laser beam 162 forms a secondary image 166, wherein the secondary image 166 falls within the primary image 136. An example of this configuration is illustrated in the close-up view FIG. 5A that shows the primary and secondary images 136 and 166. The secondary image 166 is scanned over the top surface 22 of the wafer 10, as indicated by arrow AR2. The primary image 136 can be stationary and relatively large, with the secondary image 166 scanned at least partially within. In another example embodiment illustrated in FIG. 5B, the primary image 136 can be relatively small and can be scanned, as indicated by arrow AR1, to keep up with scanned secondary image 166, as indicated by arrow AR2.

Figure 5B:
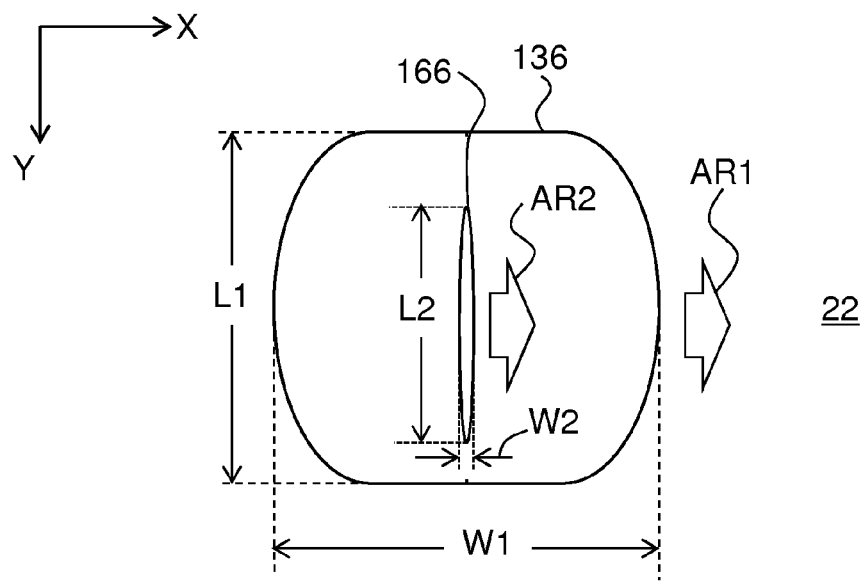
Figure 5C:
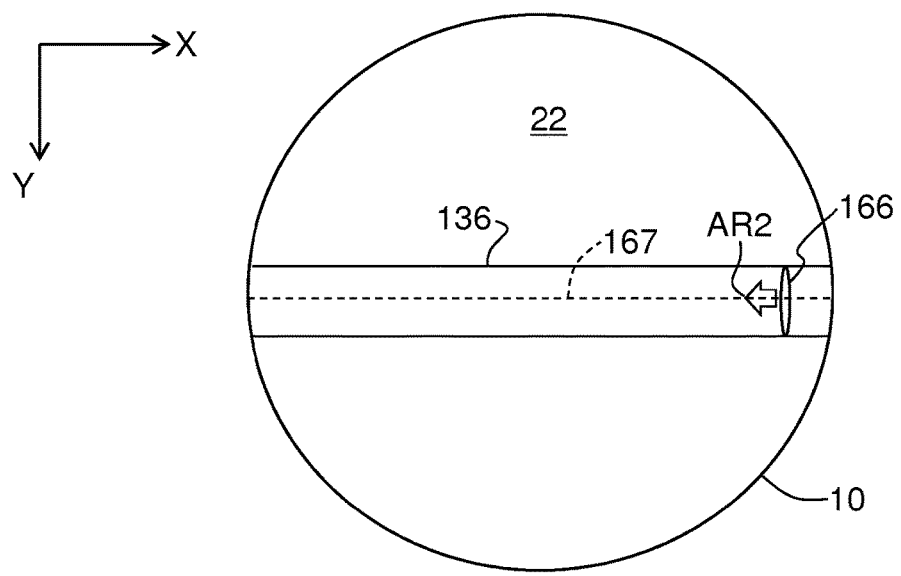
Figure 5D:
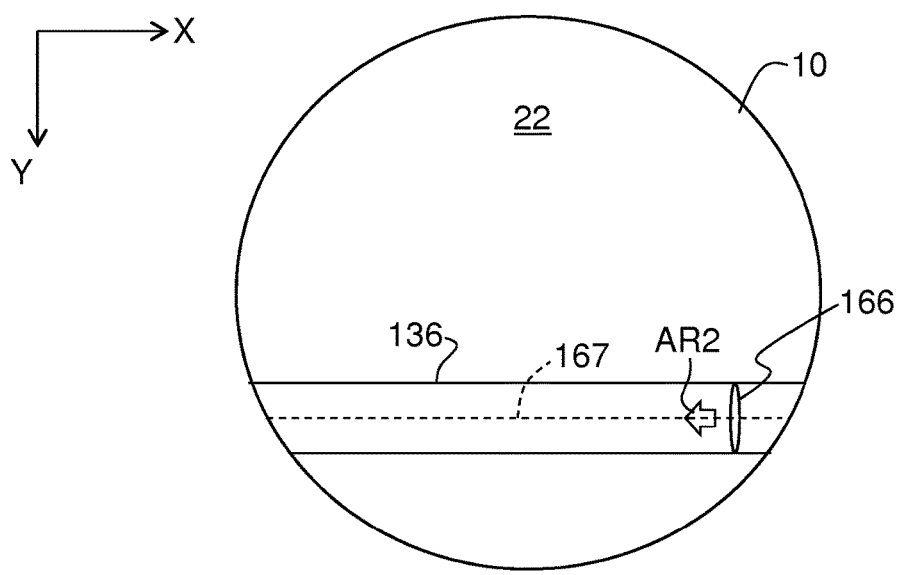
Figure 5E:
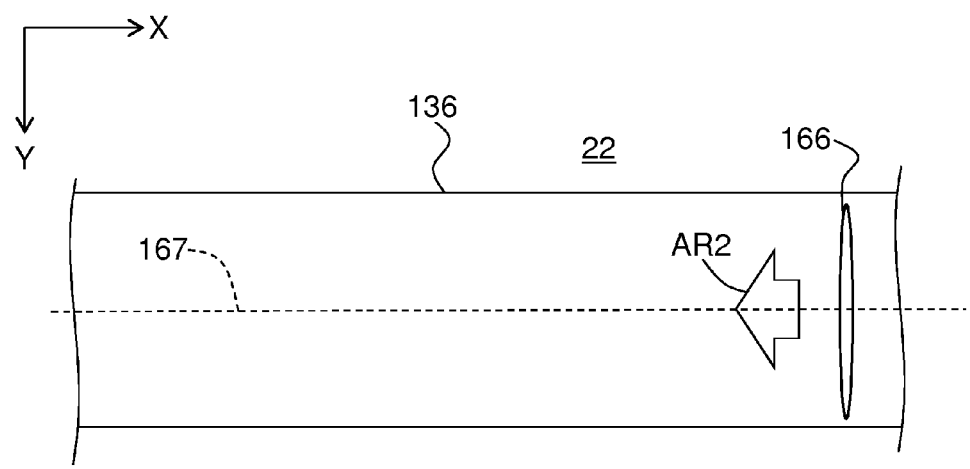

In another example embodiment shown in FIG. 5C through FIG. 5E, the primary image 136 can extend over the entire scan path 167 of the secondary image 166 so that the secondary image 166 can be scanned from one edge of the wafer 10 to the opposite edge while still residing within the primary image 136, which in this case can be stationary. This situation can be maintained even when the wafer 10 is translated to move the scan path 167 to a different portion of the top surface 22 of the wafer 10, as illustrated in FIGS. 5C and 5D, wherein in FIG. 5D the wafer 10 has been translated in the −Y direction so that the new scan path 167 is on the lower part of the wafer 10 in FIG. 5D as compared to the middle part of the wafer 10 in FIG. 5C.

As illustrated in FIG. 5B, the primary image 136 has a length L1 and a width W1 while the secondary image has a length L2 and a width W2, though the primary and secondary images 136 and 166 need not be rectangular. Example dimensions of the primary image 136 and secondary image 166 can be approximately 25 μm to 100 μm in width and 500 μm to 2000 μm in length, consistent with the condition that the secondary image 166 falls at least partially within the primary image 136.

In an example embodiment, the primary and secondary laser beams 132 and 162 have substantially Gaussian intensity profiles, so that the primary and secondary images 136 and 166 also have substantially Gaussian intensity profiles in the X and Y directions. Allowing the primary and secondary laser beams 132 and 162 to be substantially Gaussian simplifies the configurations for the primary and secondary laser systems 120 and 150, as compared to systems designed to form more square-wave (i.e., sharp-edged) intensity profiles.

In example embodiment, the primary image 136 can be slightly larger than the secondary image 166, or is substantially the same size. In an example, the primary image 136 extends ahead of the secondary image 166 in the scanning direction so that it can sufficiently heat the top surface 22 of the wafer 10 so that the light in the secondary image 166 is more readily absorbed by the top surface 22 of the wafer 10.

Prior art laser annealing systems effectuate scanning by moving wafer stage 116, which can provide scanning speeds of about 100 mm/s. However, in the system 100, at least one of the primary and secondary laser systems 120 and 150 are scanning optical systems that allow for rapidly scanning at least one of the primary and secondary laser beams 132 and 162 across the top surface 22 of the wafer 10. In an example, one or both primary and secondary laser beams 132 and 162 are configured to scan their respective primary and secondary images 136 and 166 over the top surface 22 of the wafer 10 at a scanning speed $V_S$ that is in the range from about 5 m/s to about 25 m/s. For a scanning speed $V_S$ of 25 m/s, and a beam width of 25 μm, the dwell time $t_D$ for the annealing process is 1 μs. For a scanning speed $V_S$=10 m/s and a beam width of 50 μm, the dwell time $t_D$=5 μs. To transverse a 300-mm wafer 10, a beam moving at 10 m/s would need 30 ms, which relatively speaking is a very short scanning time.

During the scan of primary and secondary laser beams 132 and 162, the thermal emission detector system 180 monitors the thermal emission radiation 182 from the location where the primary and secondary images 136 and 166 overlap and heat the top surface 22 of the wafer 10. The thermal emission detector system 180 generates the electrical thermal emission signal SE representative of the detected thermal emission and sends this electrical thermal emission signal SE to the controller 170. The controller 170 receives the electrical thermal emission signal SE and uses this electrical thermal emission signal SE to create a feed-back loop that controls the amount of power generated by at least one of the primary and secondary laser systems 120 and 150 to control the laser power so that the annealing temperature $T_A$ at the top surface 22 of the wafer 10 remains substantially constant.

After the secondary laser beam 162 and its corresponding secondary image 166 has fully scanned from one side of the wafer 10 to the other, the controller 170 causes the wafer stage 116 (via the stage control signal S0) to move to scan an adjacent portion of top surface 22 of the wafer 10. In an example, wafer 10 is moved by amount that is equal to about ⅛ of the length of scanned secondary image 166 so that adjacent scan paths 167 have substantial overlap to improve annealing uniformity. In an example, the secondary image 166 has a length L2=1 mm long so that the wafer stage 116 moves the wafer 10 in the cross-scan direction by about 125 μm. After the wafer stage 116 is so moved, the secondary laser beam 162 scans the top surface 22 of the wafer 10 in the same direction as the previous scan. In this way, the temperature history of each point on the wafer 10 is substantially the same.

In an example where the secondary laser system 150 includes a scanning mirror (as described below), and assuming that such a scanning mirror requires the same amount of time to return to its initial position as it took to scan the wafer 10, this will take an additional 30 ms. Hence, the scanning mirror has an oscillation period of 60 ms, or an oscillation period of 16.67 Hz, which is well within the capability of a conventional scanning mirror system.

In an example, the wafer stage 116 is moved at a constant velocity rather than moving it in increments after each scan of the secondary image 166. In this embodiment, the wafer stage 116 can move 125 μm in 60 ms, or 2.08 mm/sec. To fully anneal a 300-mm wafer would thus take 144 seconds. For better uniformity, the secondary laser system 150 can be configured to turn off or block the secondary laser beam 162 between scans. This function can be accomplished using a modulator 198 disposed in the path of the secondary laser beam 162.

The amount of optical power needed for laser annealing is determined by the required peak annealing temperature $T_{AP}$ and the desired annealing (dwell) time $t_D$. For longer annealing times (with subsequent larger thermal diffusion lengths $L_{DIFF}$), more volume of the wafer 10 is heated and so a larger amount of power is required. In an example embodiment, the peak annealing temperature $T_{AP}$ is between 350° C. and 1250° C. and is maintained to within +/−3° C. It is noted here that the peak annealing temperature $T_{AP}$ and the peak wafer surface temperature $T_{SP}$ are generally the same.

The throughput of the system 100 can be increases by increasing the size (i.e., length L2 and width W2) of the secondary image 166. To meet a given annealing temperature requirement, a suitably powerful laser is required. It is estimated that 200 watts of absorbed laser power is sufficient to raise the temperature of a 50 μm×1 mm area on the top surface 22 of the wafer 10 by approximately 1000° C. when the annealing (dwell) time $t_D \approx 5$ μs. Hence, if the system 100 requires a throughput of sixty 300-mm wafers/hour and an annealing temperature $T_A$ needs to reach the melting point of silicon (1413° C.), approximately one kilowatt of absorbed power is required.

One approach to achieving such a high amount of absorbed power is by providing the secondary laser 151 in the form of a fiber laser. The fiber lasers are very efficient, compact and can produce very good beam quality. The fiber lasers are most powerful in the wavelength range of $\lambda > 1$ μm, and can have outputs of multiple kilowatts in this range. Unfortunately, this wavelength range is not well absorbed by a silicon wafer at room temperature. However, a fiber-based secondary laser 151 with $\lambda > 1$ μm can be used in combination with a short-wavelength primary laser 121 as pre-heat laser to initiate surface absorption. Therefore, in an example embodiment, the primary laser 121 generates a relatively short-wavelength primary laser beam 132 that is used to pre-heat or pre-activate the top surface 22 of the wafer 10 so that the longer-wavelength secondary laser beam 162 is absorbed.

In an example embodiment, the primary laser 121 has a wavelength $\lambda_1$ in the range from 300 nm to 650 nm. In an example, the primary laser 121 includes a fiber laser that has an output wavelength in the aforementioned wavelength range for $\lambda_1$ and has an optical output in the range from about 50 watts to about 5000 watts. Other example the primary lasers 121 that can be used to pre-heat or pre-activate the top surface 22 of the wafer 10 include $CO_2$ lasers, CW diode lasers and CW solid state lasers. Preferably, the primary laser beam 132 is absorbed by the top surface 22 of the wafer 10 at room temperature and the secondary laser beam 162 is absorbed by the top surface 22 of the wafer 10 at either room temperature or at the conditions created at the top surface 22 of the wafer 10 by the primary laser beam 132.

Figure 6:
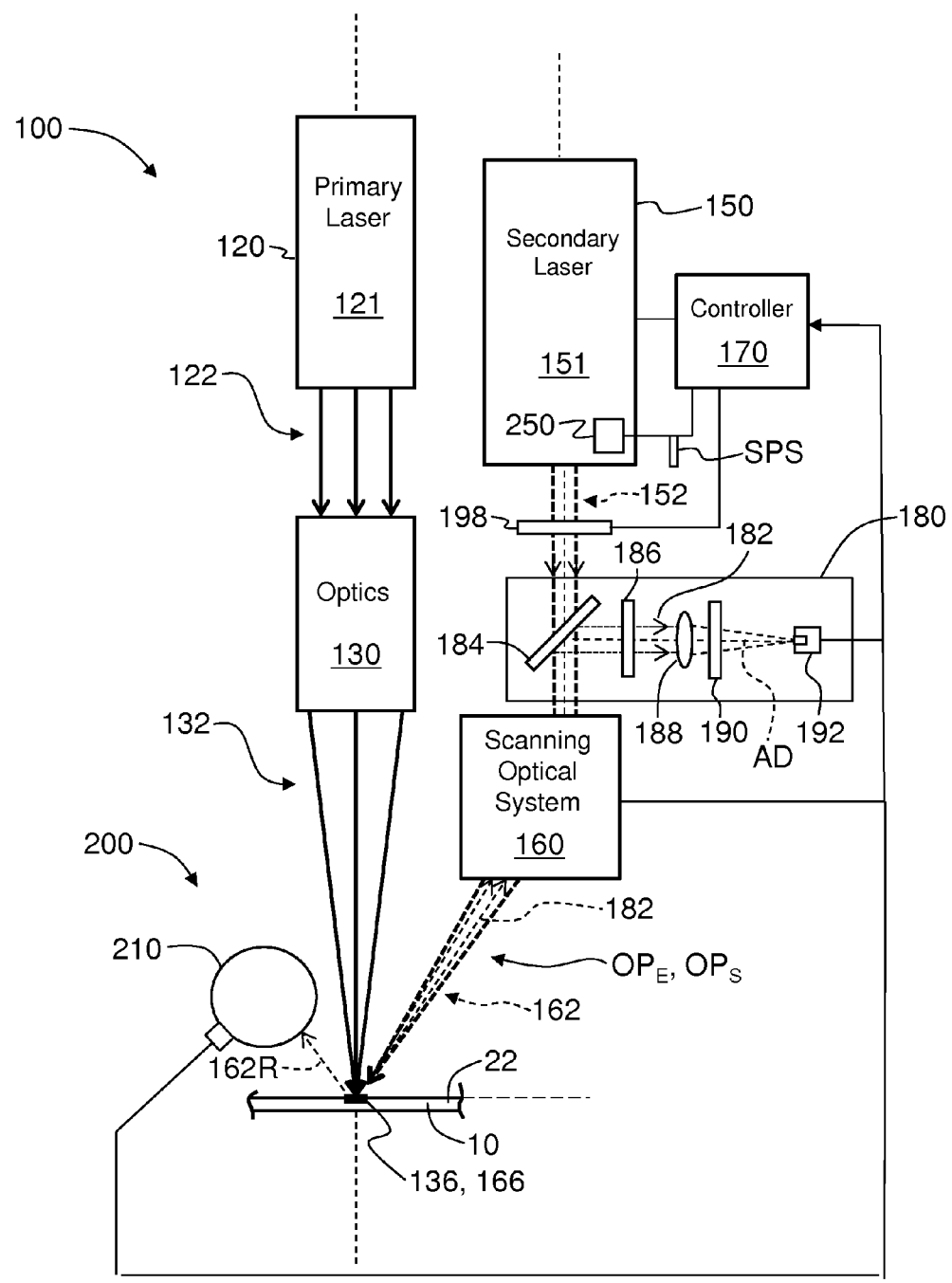
FIG. 6 is another schematic diagram of an example dual-beam ultra-fast laser annealing system that includes more details of the thermal emission detection system incorporated therein.

FIG. 6 is another schematic diagram of an example system 100 that includes more details of an example thermal emission detector system 180. The thermal emission detector system 180 includes a dichroic mirror 184 that is configured (e.g., with coatings, not shown) to transmit light of wavelength $\lambda_2$ associated with the secondary laser beam 162 but reflect light of other wavelengths, and in particular the wavelengths associated with the thermal emission radiation 182. The dichroic mirror 184 defines an optical axis AD along which is arranged a polarizer 186, a focusing lens 188, an optional filter 190, and a photodetector 192.

In the operation of system 100 of FIG. 6, the thermal emission radiation 182 is emitted by the top surface 22 of the wafer 10 in response to being heated by the primary and secondary images 136 and 166. The thermal emission radiation 182 is collected by the scanning optical system 160 and is directed to the dichroic mirror 184. The dichroic mirror 184 reflects the thermal emission radiation 182 down the optical axis AD to polarizer 186, which has the same polarization as the secondary laser system 150. The polarized thermal emission radiation 182 proceeds to the focusing lens 188, which focuses the thermal emission radiation 182 on to photodetector 192. The optical filter 190 serves to filter out extraneous wavelengths outside of the narrow wavelength band $\Delta\lambda_E$ associated with the thermal emission radiation 182. Here, an emission wavelength $\lambda_E$ can be considered a center wavelength of the narrow wavelength band $\Delta\lambda_E$.

Thus the thermal emission radiation 182 is collected point by point while the secondary image 166 is scanning over the top surface 22 of the wafer 10. In an example, the emission wavelength $\lambda_E$ μs close to wavelength $\lambda_2$ of the secondary laser beam 162 to keep aberrations to within an acceptable tolerance. In an example the focusing lens 188 is configured to at least partially compensate for aberrations that arise from the scanning optical system 160 operating at the emission wavelength $\lambda_E$.

The thermal emission detector system 180 allows for the thermal emission radiation 182 from the top surface 22 of the wafer 10 to be essentially simultaneously measure with the scanning of secondary image 166. Since the detection of thermal emission radiation 182 accomplished using a fast photodetector 192, the corresponding thermal emission signal SE is essentially immediately available for closed-loop control of the amount of optical power in the secondary image 166. This improves the needed speed for adjusting the amount of optical power in the secondary image 166 to compensate for non-uniformities in the wafer surface temperature $T_S$. This is accomplished, for example, by adjusting the control signal S2 sent by the controller 170 to the secondary laser system 150.

To accurately control the temperature of the top surface 22 of the wafer 10, one needs to be able to measure it accurately. The detection of thermal emission radiation 182 as described above by itself does not provide the wafer surface temperature $T_S$. To measure the wafer surface temperature $T_S$, the emissivity c must be measured. At a given temperature, the emissivity $\epsilon$ depends on the emission wavelength $\lambda_E$, the viewing angle, and the polarization of thermal emission radiation 182. Systems and methods applicable to the present disclosure for measuring the wafer surface temperature $T_S$ by measuring the emissivity $\epsilon$ are described in U.S. Patent Pub. No. 2012/0100640.

One method of measuring the emissivity $\epsilon$ is to determine the reflectivity and transmission of the wafer 10 at the emission wavelength $\lambda_E$. This is accomplished by employing the secondary laser beam 162. If the wavelength $\lambda_2$ of secondary laser system 150 is above or close to Si absorption edge (i.e., about 1.1 μm), then the emissivity $\epsilon$ can be measured by measuring (or otherwise determining) the reflectivity and transmissivity of secondary laser beam 162 incident upon the top surface 22 of the wafer 10. However, where $\lambda_2 < 1$ μm or for $\lambda_2 > 1$ μm in combination with the high wafer surface temperatures $T_S$ associated with laser annealing, the wafer transmissivity can be neglected and only a measurement of wafer reflectivity is needed.

Figure 7:
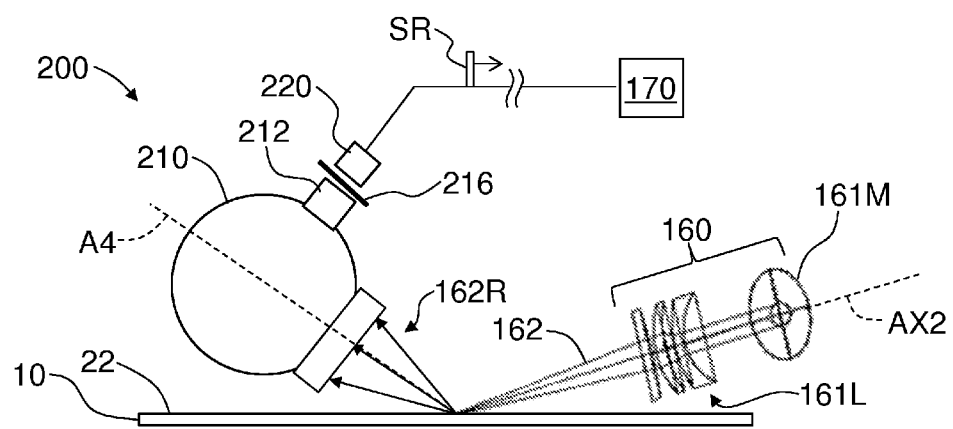
FIG. 7 is a close-up view of an example collection optical system used to collect reflected light from the wafer surface from the secondary laser beam.

For the best accuracy, as much of the reflected light 162R from the secondary laser beam 162 that reflects from the top surface 22 of the wafer 10 is collected. FIG. 7 is a close-up view of a collection optical system 200 arranged to collect the reflected light 162R. The collection optical system 200 is shown arranged relative an scanning optical system 160 that includes a scanning mirror 161M and a focusing lens 161L. The collection optical system 200 in incorporated into the system 100 and in an example includes along an axis A4 an integrating sphere 210 that includes an aperture 212. A photodetector 220 is arranged adjacent the aperture 212 to detect light that exits the integrating sphere 210 at the aperture 212. In an example, at least one neutral density filter 216 is disposed between the aperture 212 and the photodetector 220 to control the intensity of light reaching the photodetector 220. The photodetector 220 generates the reflected light signal SR representative of the power in the reflected light 162R collected by the integrating sphere 210 and provides this reflected light signal to the controller 170.

With reference again to FIG. 6, in an example embodiment system 100 includes a power sensor 250 configured to measure in real time the amount of power in the initial secondary laser beam 152, which allows for the amount of power incident upon the top surface 22 of the wafer 10 to be determined.

In an example, the power sensor 250 is shown incorporated into the secondary laser system 150. The power sensor 250 generates an electrical power signal SPS (hereinafter, the emitted-power signal) representative of the emitted laser power, which in the example shown in FIG. 6 is representative of the power in the initial secondary laser beam 152. The power sensor 250 provides the emitted-power signal SPS to the controller 170.

Note that the power sensor 250 can be located anywhere between secondary laser 151 and the top surface 22 of the wafer 10. In the case shown in FIG. 6 where the power sensor 250 is located upstream of the scanning optical system 160, the transmission of the scanning optical system 160 needs to be accounted for in determining the amount of power in the secondary laser beam 162 that is actually incident upon the top surface 22 of the wafer 10. In particular, the transmission of scanning optical system 160 can be provided to the controller 170 and used to calculate the amount of power in the secondary laser beam 162.

The emitted-power signal SPS and the reflected light signal SR are measured in real time. By comparing these two signals SPS and SR (including any calculation regarding the transmission of scanning optical system 160 as described above), the emissivity $\epsilon$ is calculated on a point-by-point basis as the secondary image 166 scans over the top surface 22 of the wafer 10. The calculated emissivity $\epsilon$ is then employed to obtain a local measurement of the wafer surface temperature $T_S$, which is insensitive to emissivity variations due to any pattern present on the top surface 22 of the wafer 10. This in turn allows for closed-loop control of the amount of power in the secondary laser beam 162 to form the secondary image 166 to achieve a substantially uniform annealing based on maintaining a substantially uniform the wafer surface temperature $T_S$ (e.g., the peak wafer surface temperature $T_{SP}$). In an example embodiment, the amount of power in the secondary laser beam 162 is controlled by the controller 170 by sending a modulation signal SM to the modulator 198, which is disposed in the optical path between the secondary laser 151 and the scanning optical system 160, e.g., in initial secondary laser beam 152.

Thus, an aspect of the system 100 includes monitoring the peak wafer surface temperature $T_{SP}$ of the top surface 22 of the wafer 10 during annealing and adjusting the amount of power in the secondary laser beam 162 so that the peak wafer surface temperature $T_{SP}$ µs maintained relatively constant.

Scanning Optical System

Figure 8A:
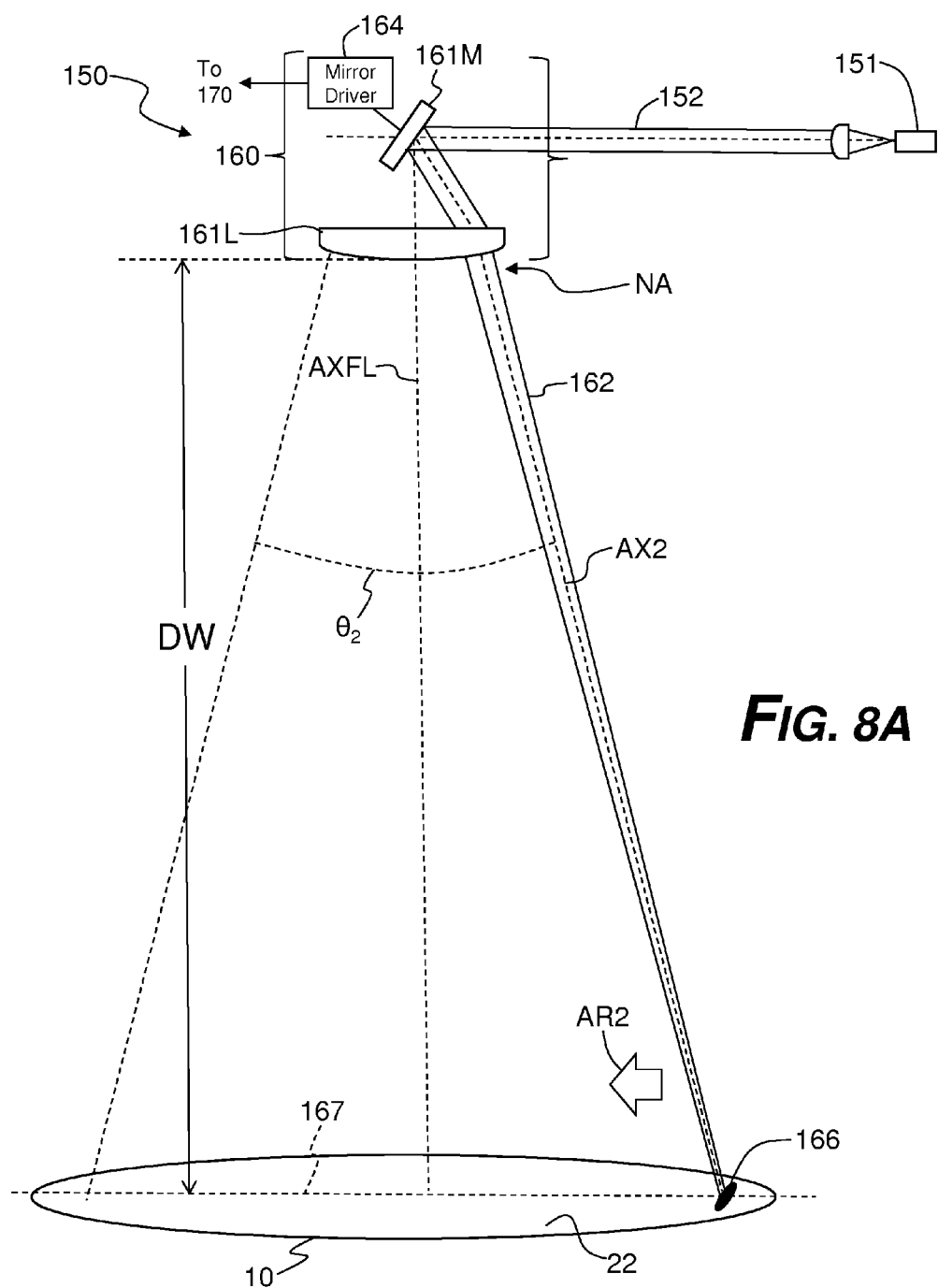
FIGS. 8A through 8C illustrate an example embodiment of a scanning optical system that has an F-theta configuration and illustrates how the scanning optical system scans the secondary laser beam and the secondary image from one edge of the wafer to the other.
Figure 8B:
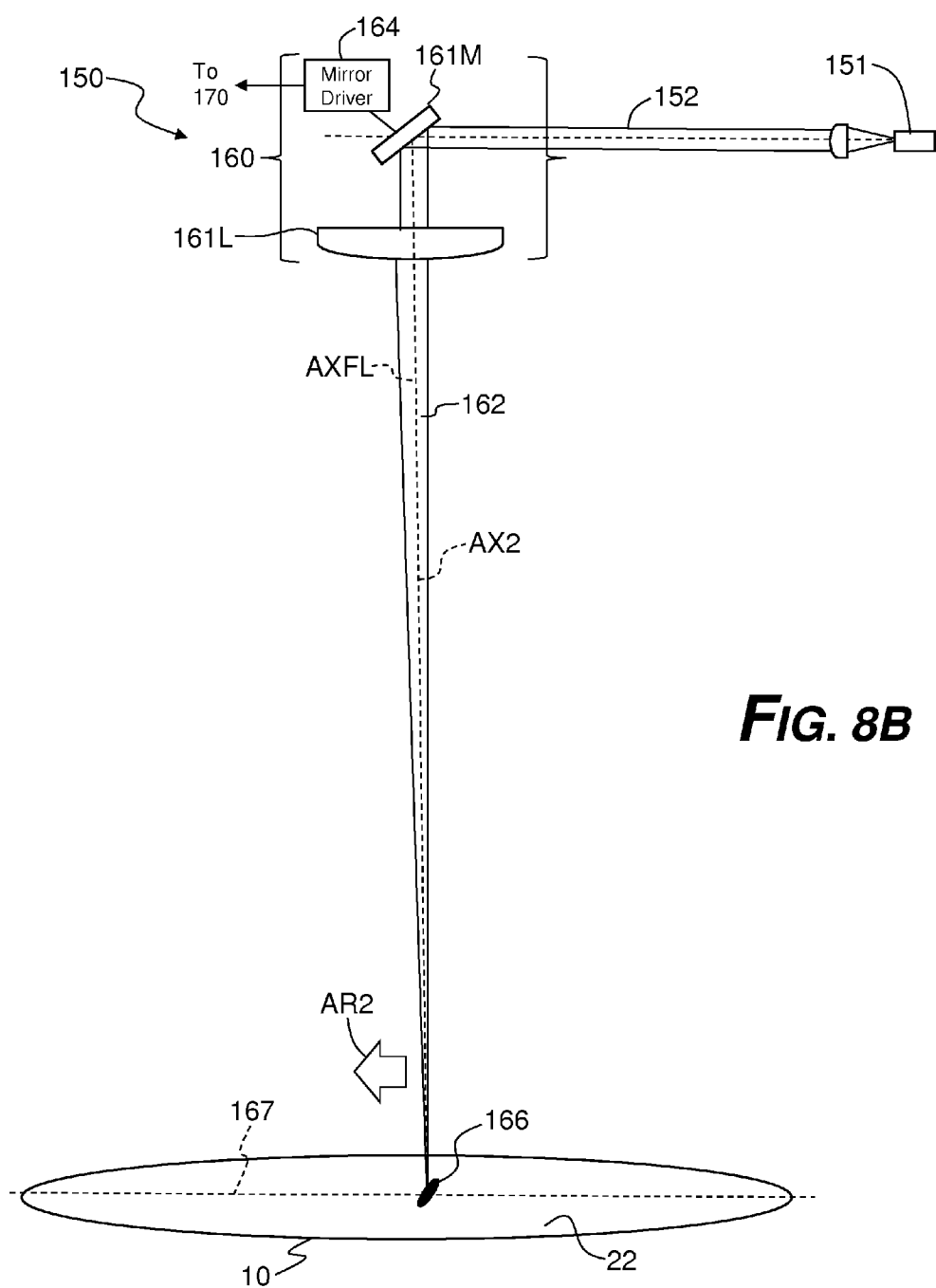
Figure 8C:
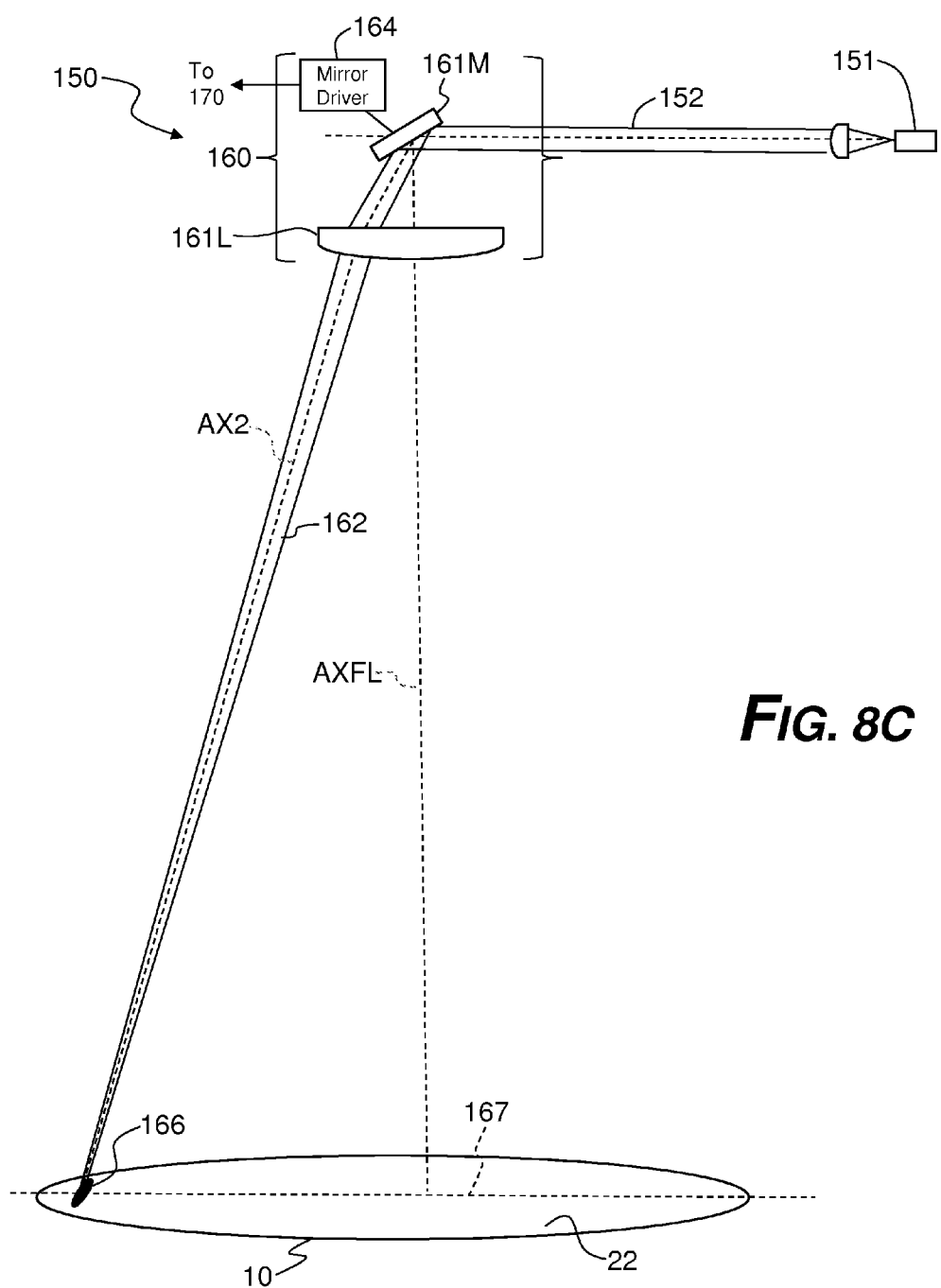
Figure 9:
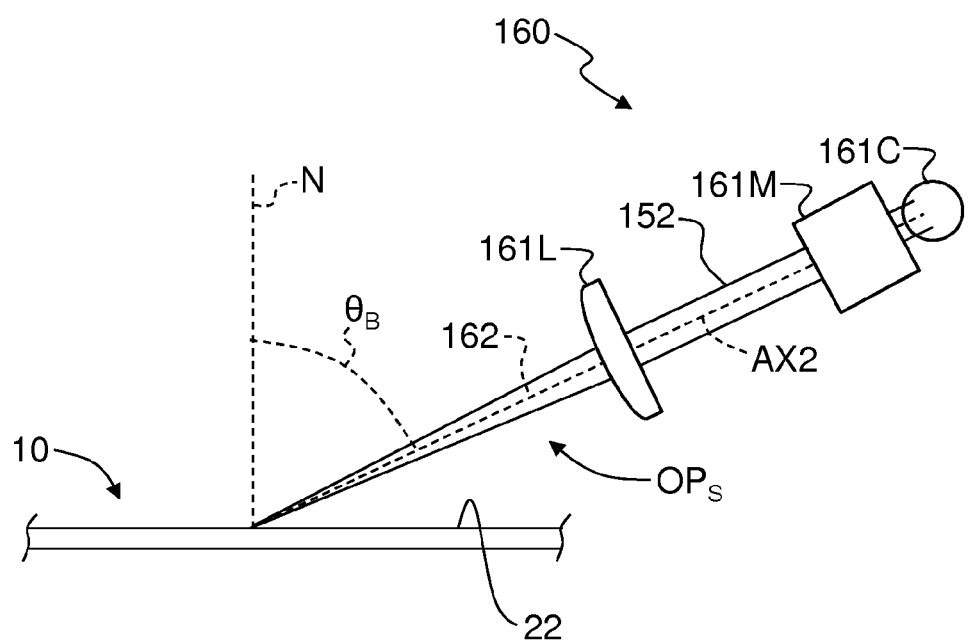
FIG. 9 is a view of the scanning optical system of FIGS. 8A through 8C from another direction and shows how the scanning optical system can be configured so that the secondary laser beam has an incident angle that is substantially the Brewster angle for silicon.

FIGS. 8A through 8C are schematic diagrams of an example scanning optical system 160 showing how the secondary laser beam 162 and the corresponding secondary image 166 are scanned over the top surface 22 of the wafer 10. FIG. 9 shows the scanning optical system 160 from another view (direction) and shows how in one example scanning optical system 160 is arranged so that the secondary laser beam 162 forms an angle $\theta_B$ with the surface normal N to the top surface 22 of the wafer 10, wherein $\theta_B$ is substantially the Brewster angle for silicon, which is about 75°. The scanning optical system 160 has an optical axis AX2 that is defined by the central light ray of the secondary laser beam 162.

Figure 10A:
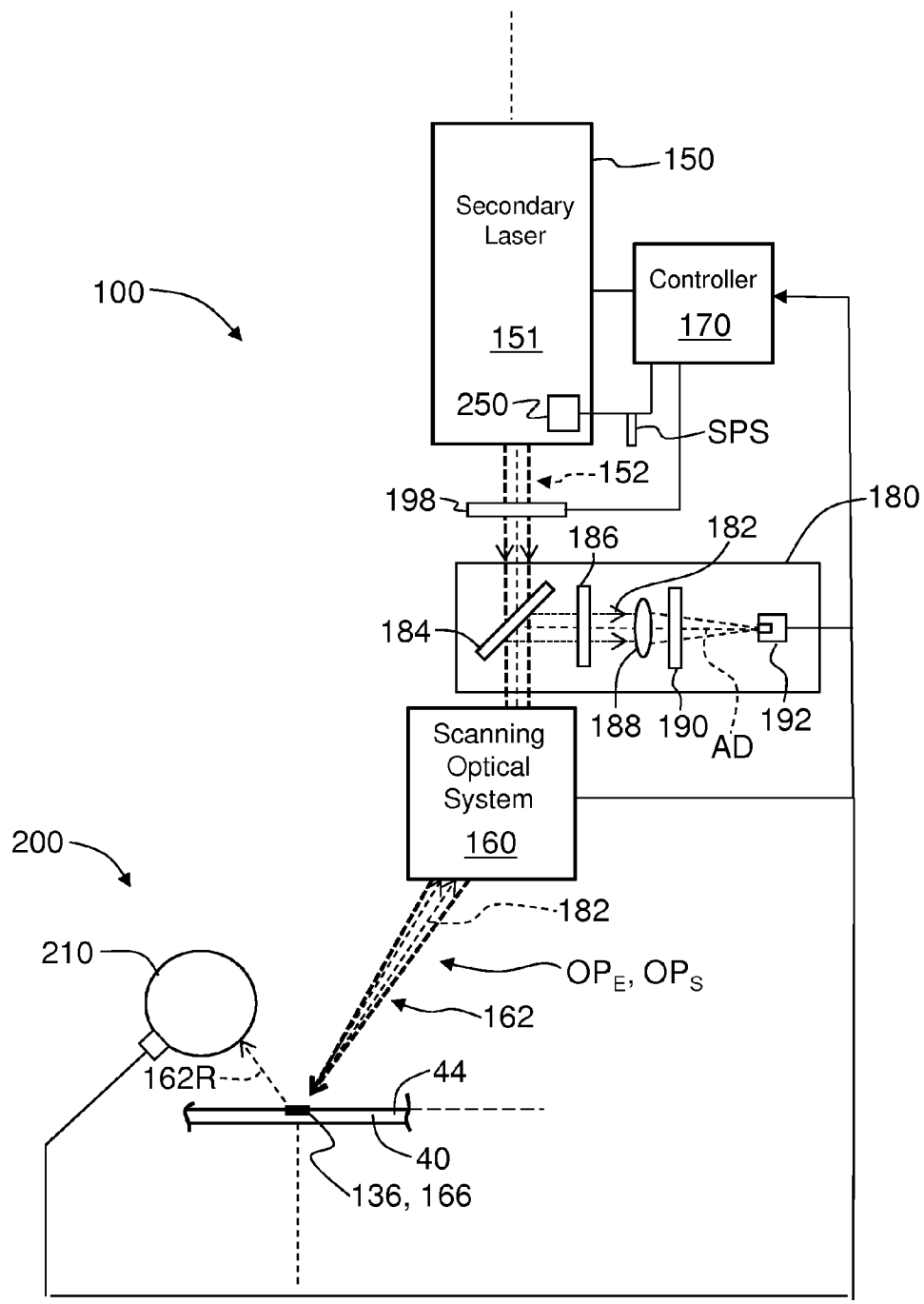
FIG. 10A is similar to FIG. 6 and illustrates an example embodiment of a laser annealing system that includes a single rapidly scanned laser beam.

FIGS. 8A through 8C and FIG. 9 can represent a single-laser annealing system such as shown in FIG. 10A, wherein the secondary laser system 150 is the only laser system so that scanned secondary laser beam 162 is the only annealing laser beam employed. In the single-laser-beam case, the laser wavelength is one that is readily absorbed by the top surface 22 of the wafer 10, e.g., $\lambda_2$ in the range from about 300 nm to about 650 nm, or generally having a wavelength that does not require the top surface 22 of the wafer 10 to be pre-heated or pre-treated by irradiation of another laser to facilitate absorption.

Alternatively FIGS. 8A through 8C and FIG. 9 can represent just one of two laser beams (see, e.g., FIG. 6), with the primary laser beam 132 not show for ease of illustration.

The scanning optical system 160 includes the scanning mirror 161M and the focusing lens 161L arranged to generally have an "F-Theta" configuration, though the secondary laser beam 162 need not be telecentric with respect to the top surface 22 of the wafer 10 over the entire scan path 167. The focusing lens 161L has an optical axis AXFL. A collimating lens 161C is shown adjacent the secondary laser 151 and forms collimated initial secondary laser beam 152. The distance from the top surface 22 of the wafer 10 to the focusing lens 161L is DW and the numerical aperture of focusing lens 161L for the relatively narrow secondary laser beam 162 is NA. An example distance DW is about 1 meter and an example NA is about 0.15. The scanning mirror 161M is operably attached to a mirror driver 164, which in turn is operably connected to the controller 170. The mirror driver 164 serves to drive the scanning mirror 161M, e.g., rapidly rotate the scanning mirror 161M through a select angular range so that the secondary laser beam 162 can scan over a corresponding select angular range denoted in FIG. 8A as $\theta_2$. In an example, the angular range $\theta_2$ is selected so that the secondary image 166 can be scanned from one edge of the wafer 10 to the opposite edge at the widest part of the wafer 10.

FIG. 8A shows the scanning optical system 160 in a state where the secondary laser beam 162 forms the secondary image 166 on the top surface 22 of the wafer 10 near one edge of the wafer 10, with the secondary laser beam 162 being scanned in the direction indicated by arrow AR2. FIG. 8B is similar to FIG. 8A except that now the scanning mirror 161M has rotated so that the secondary laser beam 162 is directed along the optical axis AXFL and the secondary image 166 is generally mid-way between the edges of wafer 10. FIG. 8C is similar to FIG. 8A except that now the scanning mirror 161M has rotated even more so that the secondary laser beam 162 and the secondary image 166 has been scanned over to the other side of wafer 10.

In an example, the scanning secondary laser beam 162 simply sweeps from side to side while the wafer 10 is translated in the cross-scan direction so that the secondary image 166 exposes different portions of the top surface 22 of the wafer 10 on each scan, or at least covers some new portion of the top surface 22 of the wafer 10 on adjacent scans (i.e., there can be some overlap of adjacent scans). Likewise, the primary image 136 can be extend all along the scan path 167 and be stationary or can move along with the secondary image 166 so that the primary image 136 pre-heats the portion of the top surface 22 of the wafer 10 to be scanned by the secondary image 166.

The system 100 can be employed for a variety of laser annealing applications. For example, if a melt annealing process is desired, the secondary laser beam 162 (as the annealing laser beam) can be used to heat the substrate to melt with a dwell time $t_D$ of about 1 µs. If a sub-melt annealing application is desired, the system 100 can be operated so that the dwell time $t_D$ µs in the range from about 1 µs to about 100 µs. Both of these types of annealing applications benefit from the in-situ temperature measurement capability of the system 100.

Photoresist Annealing

Figure 10B:
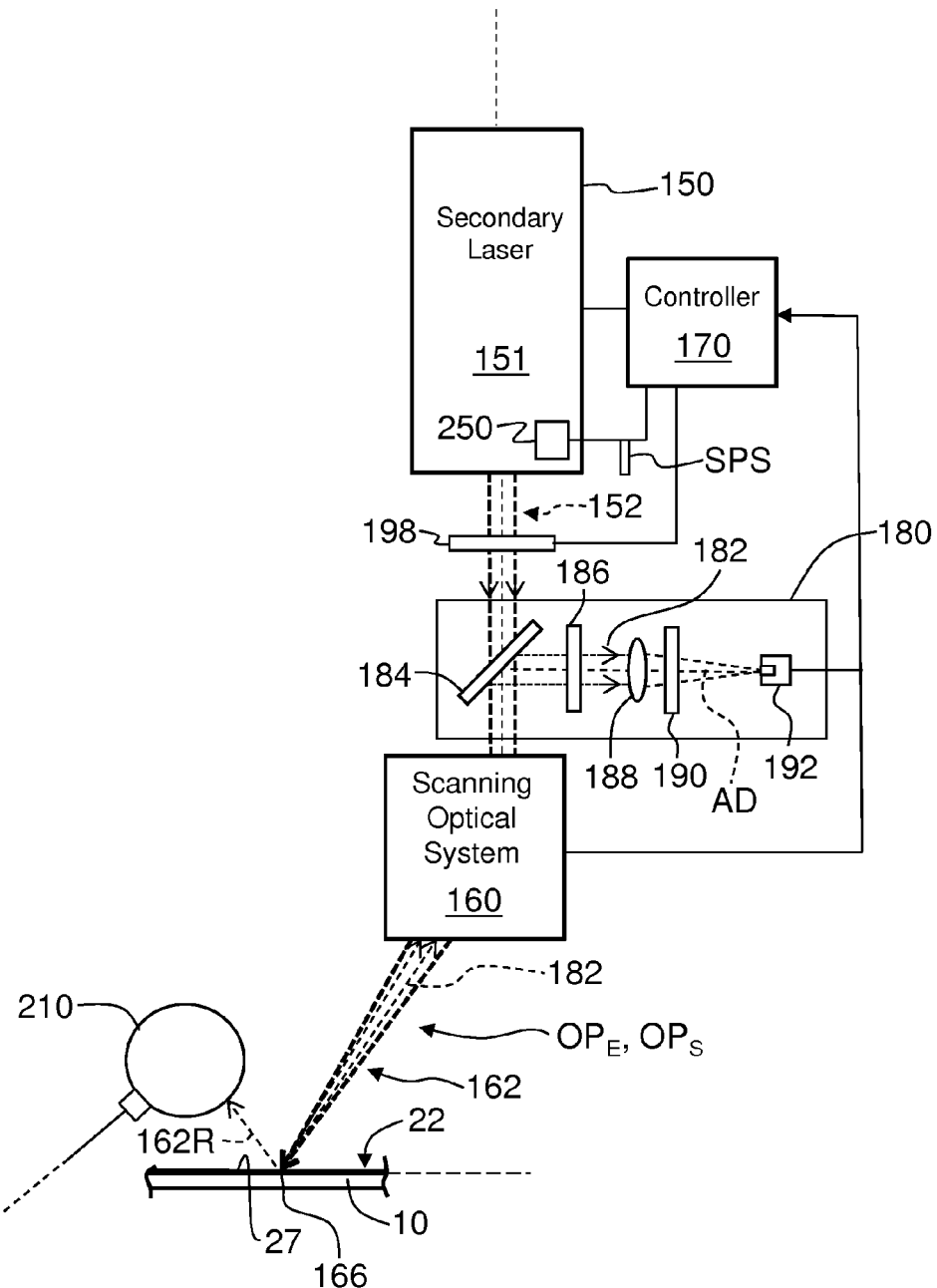
FIG. 10B is similar to FIG. 10A and illustrates an example embodiment wherein the scanning secondary laser beam from the secondary laser system is used to anneal a layer of photoresist supported on the wafer surface.

The system 100 can also be employed to anneal photoresist, particular EUV photoresist used at nominal exposure wavelength of 13.5 nm and DUV photoresist used at a nominal exposure wavelength of 193 nm. FIG. 10B is similar to FIG. 10A and illustrates an example embodiment wherein the wafer 10 includes a EUV or DUV photoresist layer 27 on the top surface 22 of the wafer 10. In this example, the photoresist layer 27 is the layer to be annealed and wafer surface simply supports the photoresist layer 27.

It has been shown that laser annealing can improve the performance of EUV and DUV photoresist layer 27 in term of both sensitivity to the exposure light and line-edge roughness. However, a key to achieving this improved performance is the temperature uniformity of the annealing. Because the system 100 is configured to control the uniformity of the annealing temperature $T_A$ using the above-described feedback loop, it enables the laser annealing of photoresist. This application may find particular use in annealing photoresist used in extreme ultraviolet (EUV) lithography, where the increased photosensitivity of the resist can reduce the amount of EUV power needed to expose the photoresist. Thus, an aspect of the disclosure includes performing ultrafast laser annealing using the system 100 as described above on a wafer 10 having the photoresist layer 27.

With photoresist annealing, the annealing secondary laser beam 162 is transmitted by the photoresist layer 27 because the photoresist layer 27 is transparent to the annealing wavelengths. Thus, the photoresist layer 27 is annealed by heating the underlying top surface 22 of the wafer 10. The annealing temperatures $T_A$ for the photoresist layer 27 are in the range from about 300° C. to about 400° C., and the dwell times $t_D$ are between 100 µs to 1 ms.

A main consideration in annealing the photoresist layer 27 is to substantially match the desired thermal diffusion length $L_{DIFF}$ (for a given dwell time $t_D$) to the optical absorption depth $D_{AD}$ of light in the underlying silicon wafer 10 because of the thermal diffusion length $L_{DIFF}$. In an example, a condition for laser annealing of the photoresist layer 27 is that the optical absorption distance $D_{AD}$ µs than the thermal diffusion length $L_{DIFF}$ (i.e., $D_{AD} < L_{DIFF}$).

For a dwell time of $t_D = 1$ ms, FIG. 2 indicates that the thermal diffusion length $L_{DIFF}$ is roughly 100 microns. Hence, it is desirable to select one or more annealing wavelengths where the optical absorption depth $D_{AD}$ is 100 microns or less. From FIG. 3, it can be seen that this condition is met for annealing wavelengths less than 980 nm at room temperature. For shorter dwell times (i.e., such as a dwell time $t_D = 10$ µs), the thermal diffusion length $L_{DIFF} = 10$ µm. The corresponding wavelength with an optical absorption depth $D_{AD}$ less than 10 µm is a wavelength less than about 650 nm. An example annealing wavelength is in the range from about 300 nm to about 1000 nm. In an example, the temperature measurement capability and feedback configuration described above is utilized in the system 100 to control the temperature uniformity of the photoresist annealing process.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. An ultra-fast laser annealing system for annealing a semiconductor wafer having a wafer surface, comprising:
    a primary laser system that forms a primary image on the wafer surface at a first wavelength, wherein the primary image increases an amount of absorption of light at a second wavelength;
    a secondary laser system that forms a secondary image on the wafer surface at the second wavelength, wherein the secondary image resides at least partially within the primary image; and
    wherein the secondary laser system includes a scanning optical system that scans the secondary image over the wafer surface to define a scan path, wherein the secondary image has a dwell time of between 1 µs and 100 µs, thereby causing the wafer surface to reach a peak annealing temperature $T_{AP}$ between 350° C. and 1250° C.

2. The ultra-fast laser annealing system of claim 1, further comprising:
    a thermal emission detector system operably arranged to detect thermal emission radiation from the wafer surface at the location of the secondary image and generate a first electrical signal;
    a collection optical system operably arranged to collect reflected light from the secondary laser beam that reflects from the wafer surface at the location of the secondary image and generate a second electrical signal;
    a power sensor arranged to measure an amount of power in the secondary laser beam and generate a third electrical signal thereof;
    a controller operably connected to the thermal emission detector system, the collection optical system, the power sensor and the secondary laser system, the controller configured to receive and process the first, second and third electrical signals and determine therefrom wafer surface temperature $T_S$ at the location of the secondary image.

3. The ultra-fast laser annealing system of claim 2, wherein the thermal emission detector system and the scanning optical system include overlapping optical path sections.

4. The ultra-fast laser annealing system of claim 2, wherein the controller is configured to control an amount of power in the secondary laser beam based on the determined wafer surface temperature $T_S$.

5. The ultra-fast laser annealing system of claim 4, wherein the primary and secondary images generate a peak annealing temperature that does not vary over the semiconductor wafer by more than +/−3° C.

6. The ultra-fast laser annealing system of claim 2, wherein the scanning optical system includes a scanning mirror operably connected to a mirror driver, wherein the mirror driver is operably connected to and controlled by the controller.

7. The ultra-fast laser annealing system of claim 1, wherein the first wavelength is in the range from 300 nm to 650 nm.

8. The ultra-fast laser annealing system of claim 1, wherein the second wavelength is in the range from 500 nm to 10.6 microns.

9. The ultra-fast laser annealing system of claim 1, wherein the secondary laser system includes a fiber laser having an output power of between 50 watts and 5000 watts.

10. The ultra-fast laser annealing system of claim 1, wherein the semiconductor wafer includes a device wafer having thickness in a range: a) from 10 µm to 100 µm, or b) from 500 µm to 1,000 µm.

11. The ultra-fast laser annealing system of claim 1, wherein the primary image remains stationary.

12. The ultra-fast laser annealing system of claim 1, wherein the secondary image falls entirely within the primary image.

13. The ultra-fast laser annealing system of claim 1, wherein the wafer has opposite edges and wherein the primary image extends between the opposite wafer edges.

14. The ultra-fast laser annealing system of claim 1, wherein the secondary image defines a line image.

15. The ultra-fast laser annealing system of claim 1, wherein the secondary image has a width in the range from 25 µm to 100 µm and a length in the range from 500 µm to 2000 µm.

16. The ultra-fast laser annealing system of claim 1, wherein the semiconductor wafer has a device surface and an opposite unpatterned surface, wherein the device surface supports device features having a melt temperature and the unpatterned surface defines the wafer surface, the method further comprising:

maintaining the device surface of the product wafer at a temperature below the melt temperature of the device features.

17. An ultra-fast laser annealing system for annealing a product wafer that includes a device wafer having a device side that supports device features having a melt temperature and an opposite unpatterned side that defines an annealing surface, the system comprising:

a laser that generates a laser beam having an annealing wavelength in the range from about 300 nm to about 650 nm;

a scanning optical system that receives the laser beam and scans the laser beam over the annealing surface as a scanned image having a dwell time of between 1 µs and 100 µs, thereby causing the annealing surface to reach a peak annealing temperature $T_{AP}$ between 350° C. and 1250° C. while maintaining the device side of the product wafer a temperature below the melt temperature of the device features.

18. The ultra-fast laser annealing system of claim 17, wherein the device wafer has a thickness in the range from about 10 µm to about 100 µm.

19. The ultra-fast laser annealing system of claim 17, wherein the scanning optical system is configured as an F-theta scanning system.

20. The ultra-fast laser annealing system of claim 17, wherein the device features comprise at least one of: CMOS features, aluminum interconnects and copper interconnects.

21. The ultra-fast laser annealing system of claim 17, wherein the device surface and the unpatterned surface define a thickness between 500 µm and 1000 µm.

22. The ultra-fast laser annealing system of claim 17, wherein the unpatterned surface includes an ion-implant layer, and wherein the scanning of the secondary image causes the ion-implant layer to become conducting.

* * * * *